(12) United States Patent
Dunlap et al.

(10) Patent No.: US 8,937,381 B1
(45) Date of Patent: Jan. 20, 2015

(54) THIN STACKABLE PACKAGE AND METHOD

(75) Inventors: Brett Arnold Dunlap, Queen Creek, AZ (US); Alexander William Copia, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 729 days.

(21) Appl. No.: 12/630,586

(22) Filed: Dec. 3, 2009

(51) Int. Cl.
*H01L 23/02* (2006.01)

(52) U.S. Cl.
USPC .................... 257/686; 257/784; 257/E23.178

(58) Field of Classification Search
USPC ................. 257/686, 678, 698, 700, 784, 786, 257/E23.178
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 3,868,724 A | 2/1975 | Perrino | |
| 3,916,434 A | 10/1975 | Garboushian | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,322,778 A | 3/1982 | Barbour et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,532,419 A | 7/1985 | Takeda | |
| 4,541,003 A | 9/1985 | Otsuka et al. | |
| 4,642,160 A | 2/1987 | Burgess | |
| 4,645,552 A | 2/1987 | Vitriol et al. | |
| 4,646,710 A | 3/1987 | Schmid et al. | |
| 4,685,033 A | 8/1987 | Inoue | |

(Continued)

FOREIGN PATENT DOCUMENTS

| | | |
|---|---|---|
| DE | 197 34 794 | 7/1998 |
| EP | 0 393 997 | 10/1990 |

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — David Vu

(74) *Attorney, Agent, or Firm* — McAndrews, Held & Malloy

(57) ABSTRACT

A fan out buildup substrate stackable package includes an electronic component having an active surface having bond pads. A package body encloses the electronic component. A first die side buildup dielectric layer is applied to the active surface of the electronic component and to a first surface of the package body. A first die side circuit pattern is formed on the first die side buildup dielectric layer and electrically connected to the bond pads. Through vias extend through the package body and the first die side buildup dielectric layer, the through vias being electrically connected to the first die side circuit pattern. The fan out buildup substrate stackable package is extremely thin and provides a high density interconnect on both sides of the package allowing additional devices to be stacked thereon.

18 Claims, 16 Drawing Sheets

(56) References Cited

U.S. PATENT DOCUMENTS

| | | |
|---|---|---|
| 4,706,167 A | 11/1987 | Sullivan |
| 4,707,724 A | 11/1987 | Suzuki et al. |
| 4,716,049 A | 12/1987 | Patraw |
| 4,727,633 A | 3/1988 | Herrick |
| 4,729,061 A | 3/1988 | Brown |
| 4,737,839 A | 4/1988 | Burt |
| 4,756,080 A | 7/1988 | Thorp, Jr. et al. |
| 4,786,952 A | 11/1988 | MacIver et al. |
| 4,806,188 A | 2/1989 | Rellick |
| 4,811,082 A | 3/1989 | Jacobs et al. |
| 4,812,896 A | 3/1989 | Rothgery et al. |
| 4,862,245 A | 8/1989 | Pashby et al. |
| 4,862,246 A | 8/1989 | Masuda et al. |
| 4,897,338 A | 1/1990 | Spicciati et al. |
| 4,905,124 A | 2/1990 | Banjo et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,964,212 A | 10/1990 | Deroux-Dauphin et al. |
| 4,974,120 A | 11/1990 | Kodai et al. |
| 4,987,475 A | 1/1991 | Schlesinger et al. |
| 4,996,391 A | 2/1991 | Schmidt |
| 5,018,003 A | 5/1991 | Yasunaga et al. |
| 5,021,047 A | 6/1991 | Movern |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,072,075 A | 12/1991 | Lee et al. |
| 5,072,520 A | 12/1991 | Nelson |
| 5,081,520 A | 1/1992 | Yoshii et al. |
| 5,087,961 A | 2/1992 | Long et al. |
| 5,091,341 A | 2/1992 | Asada et al. |
| 5,091,769 A | 2/1992 | Eichelberger |
| 5,096,852 A | 3/1992 | Hobson |
| 5,108,553 A | 4/1992 | Foster et al. |
| 5,110,664 A | 5/1992 | Nakanishi et al. |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,191,174 A | 3/1993 | Chang et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,229,550 A | 7/1993 | Bindra et al. |
| 5,239,448 A | 8/1993 | Perkins et al. |
| 5,247,429 A | 9/1993 | Iwase et al. |
| 5,250,841 A | 10/1993 | Sloan et al. |
| 5,250,843 A | 10/1993 | Eichelberger |
| 5,252,853 A | 10/1993 | Michii |
| 5,258,094 A | 11/1993 | Furui et al. |
| 5,266,834 A | 11/1993 | Nishi et al. |
| 5,268,310 A | 12/1993 | Goodrich et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,278,726 A | 1/1994 | Bernardoni et al. |
| 5,279,029 A | 1/1994 | Burns |
| 5,281,849 A | 1/1994 | Singh Deo et al. |
| 5,283,459 A | 2/1994 | Hirano et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,353,498 A | 10/1994 | Fillion et al. |
| 5,358,905 A | 10/1994 | Chiu |
| 5,365,106 A | 11/1994 | Watanabe |
| 5,371,654 A | 12/1994 | Beaman et al. |
| 5,379,191 A | 1/1995 | Carey et al. |
| 5,381,042 A | 1/1995 | Lerner et al. |
| 5,391,439 A | 2/1995 | Tomita et al. |
| 5,394,303 A | 2/1995 | Yamaji |
| 5,404,044 A | 4/1995 | Booth et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,432,677 A | 7/1995 | Mowatt et al. |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,463,253 A | 10/1995 | Waki et al. |
| 5,474,957 A | 12/1995 | Urushima |
| 5,474,958 A | 12/1995 | Djennas et al. |
| 5,484,274 A | 1/1996 | Neu |
| 5,493,151 A | 2/1996 | Asada et al. |
| 5,497,033 A | 3/1996 | Fillion et al. |
| 5,508,556 A | 4/1996 | Lin |
| 5,508,938 A | 4/1996 | Wheeler |
| 5,517,056 A | 5/1996 | Bigler et al. |
| 5,521,429 A | 5/1996 | Aono et al. |
| 5,528,076 A | 6/1996 | Pavio |
| 5,530,288 A | 6/1996 | Stone |
| 5,531,020 A | 7/1996 | Durand et al. |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,546,654 A | 8/1996 | Wojnarowski et al. |
| 5,574,309 A | 11/1996 | Papapietro et al. |
| 5,576,517 A | 11/1996 | Wojnarowski et al. |
| 5,578,525 A | 11/1996 | Mizukoshi |
| 5,581,122 A | 12/1996 | Chao et al. |
| 5,581,498 A | 12/1996 | Ludwig et al. |
| 5,582,858 A | 12/1996 | Adamopoulos et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,616,422 A | 4/1997 | Ballard et al. |
| 5,619,068 A | 4/1997 | Benzoni |
| 5,625,222 A | 4/1997 | Yoneda et al. |
| 5,633,528 A | 5/1997 | Abbott et al. |
| 5,637,832 A | 6/1997 | Danner |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,674,785 A | 10/1997 | Akram et al. |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,719,749 A | 2/1998 | Stopperan |

(56) References Cited

U.S. PATENT DOCUMENTS

| | | |
|---|---|---|
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,736,448 A | 4/1998 | Saia et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,769,989 A | 6/1998 | Hoffmeyer et al. |
| 5,770,888 A | 6/1998 | Song et al. |
| 5,774,340 A | 6/1998 | Chang et al. |
| 5,776,798 A | 7/1998 | Quan et al. |
| 5,783,861 A | 7/1998 | Son |
| 5,784,259 A | 7/1998 | Asakura |
| 5,786,238 A | 7/1998 | Pai et al. |
| 5,798,014 A | 8/1998 | Weber |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,822,190 A | 10/1998 | Iwasaki |
| 5,826,330 A | 10/1998 | Isoda et al. |
| 5,834,830 A | 11/1998 | Cho |
| 5,835,355 A | 11/1998 | Dordi |
| 5,835,988 A | 11/1998 | Ishii |
| 5,841,193 A | 11/1998 | Eichelberger |
| 5,844,306 A | 12/1998 | Fujita et al. |
| 5,847,453 A | 12/1998 | Uematsu et al. |
| 5,856,911 A | 1/1999 | Riley |
| 5,859,471 A | 1/1999 | Kuraishi et al. |
| 5,859,475 A | 1/1999 | Freyman et al. |
| 5,866,939 A | 2/1999 | Shin et al. |
| 5,871,782 A | 2/1999 | Choi |
| 5,874,770 A | 2/1999 | Saia et al. |
| 5,874,784 A | 2/1999 | Aoki et al. |
| 5,877,043 A | 3/1999 | Alcoe et al. |
| 5,883,425 A | 3/1999 | Kobayashi |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,903,052 A | 5/1999 | Chen et al. |
| 5,907,477 A | 5/1999 | Tuttle et al. |
| 5,909,053 A | 6/1999 | Fukase et al. |
| 5,915,998 A | 6/1999 | Stidham et al. |
| 5,917,242 A | 6/1999 | Ball |
| 5,936,843 A | 8/1999 | Ohshima et al. |
| 5,937,324 A | 8/1999 | Abercrombie et al. |
| 5,939,779 A | 8/1999 | Kim |
| 5,942,794 A | 8/1999 | Okumura et al. |
| 5,951,305 A | 9/1999 | Haba |
| 5,952,611 A | 9/1999 | Eng et al. |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,982,632 A | 11/1999 | Mosley et al. |
| 5,986,333 A | 11/1999 | Nakamura |
| 5,986,885 A | 11/1999 | Wyland |
| 6,001,671 A | 12/1999 | Fjelstad |
| 6,004,619 A | 12/1999 | Dippon et al. |
| 6,013,947 A | 1/2000 | Lim |
| 6,013,948 A | 1/2000 | Akram et al. |
| 6,018,189 A | 1/2000 | Mizuno |
| 6,020,625 A | 2/2000 | Qin et al. |
| 6,021,564 A | 2/2000 | Hanson |
| 6,025,640 A | 2/2000 | Yagi et al. |
| 6,028,364 A | 2/2000 | Ogino et al. |
| 6,031,279 A | 2/2000 | Lenz |
| RE36,613 E | 3/2000 | Ball |
| 6,034,423 A | 3/2000 | Mostafazadeh et al. |
| 6,034,427 A | 3/2000 | Lan et al. |
| 6,035,527 A | 3/2000 | Tamm |
| 6,040,622 A | 3/2000 | Wallace |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,060,778 A | 5/2000 | Jeong et al. |
| 6,069,407 A | 5/2000 | Hamzehdoost |
| 6,072,228 A | 6/2000 | Hinkle et al. |
| 6,072,243 A | 6/2000 | Nakanishi |
| 6,075,284 A | 6/2000 | Choi et al. |
| 6,081,029 A | 6/2000 | Yamaguchi |
| 6,081,036 A | 6/2000 | Hirano et al. |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Shih et al. |
| 6,114,752 A | 9/2000 | Huang et al. |
| 6,118,174 A | 9/2000 | Kim |
| 6,118,184 A | 9/2000 | Ishio et al. |
| 6,119,338 A | 9/2000 | Wang et al. |
| 6,122,171 A | 9/2000 | Akram et al. |
| RE36,907 E | 10/2000 | Templeton, Jr. et al. |
| 6,127,833 A | 10/2000 | Wu et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,160,705 A | 12/2000 | Stearns et al. |
| 6,169,329 B1 | 1/2001 | Farnworth et al. |
| 6,172,419 B1 | 1/2001 | Kinsman |
| 6,175,087 B1 | 1/2001 | Keesler et al. |
| 6,177,718 B1 | 1/2001 | Kozono |
| 6,181,002 B1 | 1/2001 | Juso et al. |
| 6,184,463 B1 | 2/2001 | Panchou et al. |
| 6,184,465 B1 | 2/2001 | Corisis |
| 6,184,573 B1 | 2/2001 | Pu |
| 6,194,250 B1 | 2/2001 | Melton et al. |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,453 B1 | 3/2001 | Fallon et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,214,525 B1 | 4/2001 | Boyko et al. |
| 6,214,641 B1 | 4/2001 | Akram |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,235,554 B1 | 5/2001 | Akram et al. |
| 6,239,367 B1 | 5/2001 | Hsuan et al. |
| 6,239,384 B1 | 5/2001 | Smith et al. |
| 6,239,485 B1 | 5/2001 | Peters et al. |
| 6,242,281 B1 | 6/2001 | Mclellan et al. |
| D445,096 S | 7/2001 | Wallace |

(56) References Cited

U.S. PATENT DOCUMENTS

| | | |
|---|---|---|
| 6,256,200 B1 | 7/2001 | Lam et al. |
| 6,258,192 B1 | 7/2001 | Natarajan |
| 6,258,629 B1 | 7/2001 | Niones et al. |
| 6,261,918 B1 | 7/2001 | So |
| D446,525 S | 8/2001 | Okamoto et al. |
| 6,274,821 B1 | 8/2001 | Echigo et al. |
| 6,280,641 B1 | 8/2001 | Gaku et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,285 B1 | 11/2001 | Jiang et al. |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,351,031 B1 | 2/2002 | Iijima et al. |
| 6,353,999 B1 | 3/2002 | Cheng |
| 6,355,502 B1 | 3/2002 | Kang et al. |
| 6,365,974 B1 | 4/2002 | Abbott et al. |
| 6,365,975 B1 | 4/2002 | DiStefano et al. |
| 6,369,447 B2 | 4/2002 | Mori |
| 6,369,454 B1 | 4/2002 | Chung |
| 6,373,127 B1 | 4/2002 | Baudouin et al. |
| 6,376,906 B1 | 4/2002 | Asai et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,392,160 B1 | 5/2002 | Andry et al. |
| 6,395,578 B1 | 5/2002 | Shin et al. |
| 6,396,148 B1 | 5/2002 | Eichelberger et al. |
| 6,396,153 B2 | 5/2002 | Fillion et al. |
| 6,400,004 B1 | 6/2002 | Fan et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,510 B1 | 9/2002 | Neftin et al. |
| 6,448,633 B1 | 9/2002 | Yee et al. |
| 6,451,509 B2 | 9/2002 | Keesler et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,479,762 B2 | 11/2002 | Kusaka |
| 6,482,680 B1 | 11/2002 | Khor et al. |
| 6,497,943 B1 | 12/2002 | Jimarez et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,517,995 B1 | 2/2003 | Jacobson et al. |
| 6,521,530 B2 | 2/2003 | Peters et al. |
| 6,524,885 B2 | 2/2003 | Pierce |
| 6,534,391 B1 | 3/2003 | Huemoeller et al. |
| 6,534,849 B1 | 3/2003 | Gang |
| 6,544,638 B2 | 4/2003 | Fischer et al. |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,583,503 B2 | 6/2003 | Akram et al. |
| 6,586,682 B2 | 7/2003 | Strandberg |
| 6,593,645 B2 | 7/2003 | Shih et al. |
| 6,603,196 B2 | 8/2003 | Lee et al. |
| 6,608,757 B1 | 8/2003 | Bhatt et al. |
| 6,624,005 B1 | 9/2003 | DiCaprio et al. |
| 6,660,559 B1 | 12/2003 | Huemoeller et al. |
| 6,667,546 B2 | 12/2003 | Huang et al. |
| 6,671,398 B2 | 12/2003 | Reinhorn et al. |
| 6,705,512 B2 | 3/2004 | Ho et al. |
| 6,715,204 B1 | 4/2004 | Tsukada et al. |
| 6,727,576 B2 | 4/2004 | Hedler et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,831,371 B1 | 12/2004 | Huemoeller et al. |
| 6,838,776 B2 | 1/2005 | Leal et al. |
| 6,845,554 B2 | 1/2005 | Frankowsky et al. |
| 6,888,240 B2 | 5/2005 | Towle et al. |
| 6,905,914 B1 | 6/2005 | Huemoeller et al. |
| 6,919,514 B2 | 7/2005 | Konrad et al. |
| 6,921,968 B2 | 7/2005 | Chung |
| 6,921,975 B2 | 7/2005 | Leal et al. |
| 6,930,256 B1 | 8/2005 | Huemoeller et al. |
| 6,931,726 B2 | 8/2005 | Boyko et al. |
| 6,953,995 B2 | 10/2005 | Farnworth et al. |
| 7,015,075 B2 | 3/2006 | Fay et al. |
| 7,030,469 B2 | 4/2006 | Mahadevan et al. |
| 7,041,534 B2 | 5/2006 | Chao et al. |
| 7,057,290 B2 | 6/2006 | Sunohara et al. |
| 7,081,661 B2 | 7/2006 | Takehara et al. |
| 7,125,744 B2 | 10/2006 | Takehara et al. |
| 7,129,158 B2 | 10/2006 | Nakai |
| 7,185,426 B1 | 3/2007 | Hiner et al. |
| 7,190,062 B1 | 3/2007 | Sheridan et al. |
| 7,192,807 B1 | 3/2007 | Huemoeller et al. |
| 7,198,980 B2 | 4/2007 | Jiang et al. |
| 7,242,081 B1 | 7/2007 | Lee |
| 7,247,523 B1 | 7/2007 | Huemoeller et al. |
| 7,272,444 B2 | 9/2007 | Peterson et al. |
| 7,282,394 B2 | 10/2007 | Cho et al. |
| 7,285,855 B2 | 10/2007 | Foong |
| 7,321,164 B2 * | 1/2008 | Hsu ............................ 257/686 |
| 7,345,361 B2 | 3/2008 | Mallik et al. |
| 7,361,533 B1 | 4/2008 | Huemoeller et al. |
| 7,372,151 B1 | 5/2008 | Fan et al. |
| 7,420,272 B1 | 9/2008 | Huemoeller et al. |
| 7,429,786 B2 | 9/2008 | Karnezos et al. |
| 7,459,202 B2 | 12/2008 | Magera et al. |
| 7,514,767 B2 * | 4/2009 | Yang ............................ 257/666 |
| 7,548,430 B1 | 6/2009 | Huemoeller et al. |
| 7,550,857 B1 | 6/2009 | Longo et al. |
| 7,572,681 B1 | 8/2009 | Huemoeller et al. |
| 7,588,951 B2 * | 9/2009 | Mangrum et al. ............... 438/25 |
| 7,633,765 B1 | 12/2009 | Scanlan et al. |
| 7,807,512 B2 * | 10/2010 | Lee et al. .................... 438/127 |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2002/0017712 A1 | 2/2002 | Bessho et al. |
| 2002/0024122 A1 | 2/2002 | Jung et al. |
| 2002/0027297 A1 | 3/2002 | Ikenaga et al. |

(56) References Cited

U.S. PATENT DOCUMENTS

| | | |
|---|---|---|
| 2002/0061642 A1 | 5/2002 | Haji et al. |
| 2002/0066952 A1 | 6/2002 | Taniguchi et al. |
| 2002/0140061 A1 | 10/2002 | Lee |
| 2002/0140068 A1 | 10/2002 | Lee et al. |
| 2002/0163015 A1 | 11/2002 | Lee et al. |
| 2002/0195697 A1 | 12/2002 | Mess et al. |
| 2003/0013232 A1 | 1/2003 | Towle et al. |
| 2003/0025199 A1 | 2/2003 | Wu et al. |
| 2003/0030131 A1 | 2/2003 | Lee et al. |
| 2003/0064548 A1 | 4/2003 | Isaak |
| 2003/0073265 A1 | 4/2003 | Hu et al. |
| 2003/0128096 A1 | 7/2003 | Mazzochette |
| 2003/0134451 A1 | 7/2003 | Chen |
| 2003/0134455 A1 | 7/2003 | Cheng et al. |
| 2003/0141582 A1 | 7/2003 | Yang et al. |
| 2003/0197284 A1 | 10/2003 | Khiang et al. |
| 2004/0004293 A1 | 1/2004 | Murayama |
| 2004/0026781 A1 | 2/2004 | Nakai |
| 2004/0046244 A1 | 3/2004 | Nakamura et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0113260 A1 | 6/2004 | Sunohara et al. |
| 2004/0145044 A1 | 7/2004 | Sugaya et al. |
| 2004/0159462 A1 | 8/2004 | Chung |
| 2004/0159933 A1 | 8/2004 | Sunohara et al. |
| 2004/0188136 A1 | 9/2004 | Sunohara et al. |
| 2005/0029644 A1 | 2/2005 | Ho et al. |
| 2005/0139985 A1 | 6/2005 | Takahashi |
| 2005/0242425 A1 | 11/2005 | Leal et al. |
| 2005/0282314 A1 | 12/2005 | Lo et al. |
| 2006/0124347 A1 | 6/2006 | Takaike |
| 2006/0208356 A1 | 9/2006 | Yamano et al. |
| 2007/0222062 A1 | 9/2007 | Sunohara et al. |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0067666 A1 | 3/2008 | Hsu |
| 2008/0157336 A1 | 7/2008 | Yang |
| 2008/0230887 A1 | 9/2008 | Sun et al. |

FOREIGN PATENT DOCUMENTS

| | | |
|---|---|---|
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-109975 | 4/1993 |
| JP | 05-129473 | 5/1993 |
| JP | 05-136323 | 6/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-017175 | 1/1995 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-190615 | 7/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 10-334205 | 12/1998 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | WO 99/56316 | 11/1999 |
| WO | WO 99/67821 | 12/1999 |

OTHER PUBLICATIONS

Kim et al., "Application of Through Mold Via (TMV) as PoP base package", *58th ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Hiner et al., "Printed Wiring Motherboard Having Bonded Interconnect Redistribution Mesa", U.S. Appl. No. 10/992,371, filed Nov. 18, 2004.

Berry et al., "Direct-Write Wafer Level Chip Scale Package", U.S. Appl. No. 11/289,826, filed Nov. 29, 2005.

Lee et al., "Substrate for Semiconductor Device and Manufacturing Method Thereof", U.S. Appl. No. 11/440,548, filed May 24, 2006.

Hiner et al., "Semiconductor Package Including Top-Surface Terminals for Mounting Another Semiconductor Package", U.S. Appl. No. 11/595,411, filed Nov. 9, 2006.

Huemoeller et al., "Electronic Component Package Comprising Fan-out and Fan-in Traces", U.S. Appl. No. 11/605,740, filed Nov. 28, 2006.

Berry et al., "Direct-write Wafer Level Chip Scale Package", U.S. Appl. No. 11/810,799, filed Jun. 6, 2007.

Huemoeller et al., "Build Up Motherboard Fabrication Method and Structure", U.S. Appl. No. 11/824,395, filed Jun. 29, 2007.

Berry et al., "Thin Stacked Interposer Package", U.S. Appl. No. 11/865,617, filed Oct. 1, 2007.

Huemoeller et al., "Two-sided Fan-out Wafer Escape Package", U.S. Appl. No. 12/221,797, filed Aug. 5, 2008.

(56) References Cited

OTHER PUBLICATIONS

Longo et al., "Stacked Redistribution Layer (RDL) Die Assembly Package", U.S. Appl. No. 12/387,672, filed May 5, 2009.
Huemoeller et al., "Buildup Dielectric Layer Having Metallization Pattern Semiconductor Package Fabrication Method", U.S. Appl. No. 12/387,691, filed May 5, 2009.
Miller Jr. et al., "Thermal Via Heat Spreader Package and Method", U.S. Appl. No. 12/421,118, filed Apr. 9, 2009.
Huemoeller et al., "Embedded Electronic Component Package Fabrication Method", U.S. Appl. No. 12/459,532, filed Jul. 2, 2009.
Scanlan et al., "Fan Out Build Up Substrate Stackable Package and Method", U.S. Appl. No. 12/573,466, filed Oct. 5, 2009.
Scanlan et al., "Semiconductor Package Including a Top-Surface Metal Layer for Implementing Circuit Features", U.S. Appl. No. 12/589,839, filed Oct. 28, 2009.

* cited by examiner

THIN STACKABLE PACKAGE AND METHOD

BACKGROUND OF THE INVENTION

1. Field of the Invention

The present application relates to the field of electronics, and more particularly, to methods of forming electronic component packages and related structures.

2. Description of the Related Art

To reduce the size of electronic devices such as cell phones, it is desirable to minimize the thickness of electronic component packages used within the electronic devices as well as the mounting area required to mount the electronic component packages. Often, electronic component packages are stacked one upon another to reduce the mounting area required for the electronic component packages as compared to mounting the electronic component packages in a side by side arrangement. Unfortunately, stacking the electronic component packages results in an undesirable increased thickness as compared to mounting the electronic component packages in a side by side arrangement.

SUMMARY OF THE INVENTION

A fan out buildup substrate stackable package includes an electronic component having an active surface having bond pads. A package body encloses the electronic component. A first die side buildup dielectric layer is applied to the active surface of the electronic component and to a first surface of the package body. A first die side circuit pattern is formed on the first die side buildup dielectric layer and electrically connected to the bond pads. Through vias extend through the package body and the first die side buildup dielectric layer, the through vias being electrically connected to the first die side circuit pattern. The fan out buildup substrate stackable package is extremely thin and provides a high density interconnect on both sides of the package allowing additional devices to be stacked thereon.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
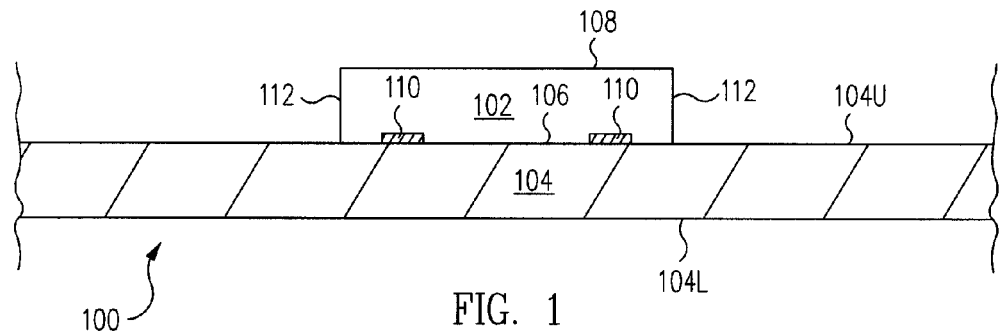
FIG. 1 is a cross-sectional view of a fan out buildup substrate stackable package during fabrication in accordance with one embodiment.

FIG. 1 is a cross-sectional view of a fan out buildup substrate stackable package 100 during fabrication in accordance with one embodiment. Referring now to FIG. 1, an electronic component 102 is mounted to a carrier 104, sometimes called a support panel.

In one embodiment, electronic component 102 is an integrated circuit chip, e.g., an active component. However, in other embodiments, electronic component 102 is a passive component such as a capacitor, resistor, or inductor.

In accordance with this embodiment, electronic component 102 includes an active surface 106 and an opposite inactive surface 108. Electronic component 102 further includes bond pads 110 formed on active surface 106 and sides 112 extending between active surface 106 and inactive surface 108.

In one embodiment, carrier 104 includes an adhesive on an upper, e.g., first, surface 104U of carrier 104. Carrier 104 further includes a lower, e.g., second, surface 104L.

Active surface 106 of electronic component 102 is pressed into upper surface 104U of carrier 104 and thus sticks to carrier 104. However, in other embodiments, an adhesive is applied to active surface 106 of electronic component 102, and this adhesive is pressed into carrier 104 to stick electronic component 102 to carrier 104.

Figure 2:
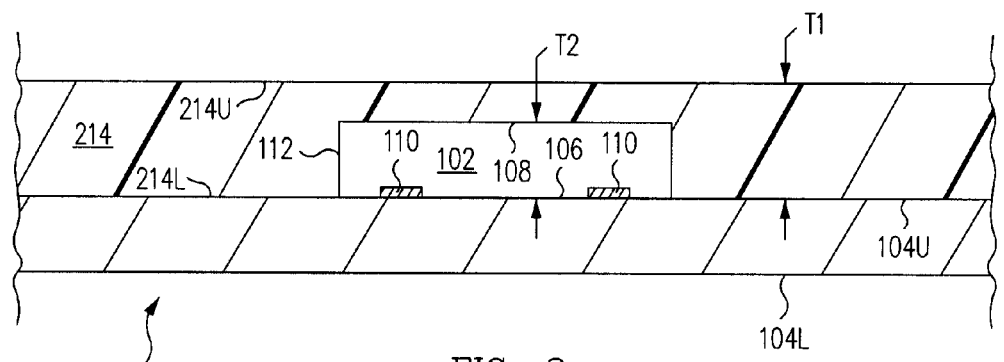
FIGS. 2, 3, 4 are cross-sectional views of the fan out buildup substrate stackable package of FIG. 1 at later stages during fabrication in accordance with various embodiments.

FIG. 2 is a cross-sectional view of fan out buildup substrate stackable package 100 of FIG. 1 at a later stage during fabrication in accordance with one embodiment. Referring now to FIG. 2, electronic component 102 is encapsulated in a dielectric package body 214.

Illustratively, electronic component 102 and carrier 104 are placed into a mold and mold compound is injected into the mold and around electronic component 102. This mold compound hardens to form package body 214. Thus, in accordance with this embodiment, package body 214 is formed of mold compound. However, in other embodiments, package body 214 is formed of other dielectric materials such as hardened liquid encapsulant.

Package body 214 includes a lower, e.g., first, surface 214L attached to upper surface 104U of carrier 104 and an upper, e.g., second, surface 214U. Package body 214 completely encloses electronic component 102 including inactive surface 108 and sides 112 and the exposed portion of upper surface 104U of carrier 104. Lower surface 214L is coplanar with active surface 106 of electronic component 102.

Package body 214 is thicker having a thickness T1 greater than a thickness T2 of electronic component 102. More particularly, upper surface 214U is above and spaced apart from inactive surface 108 such that inactive surface 108 is covered in package body 214.

Figure 3:
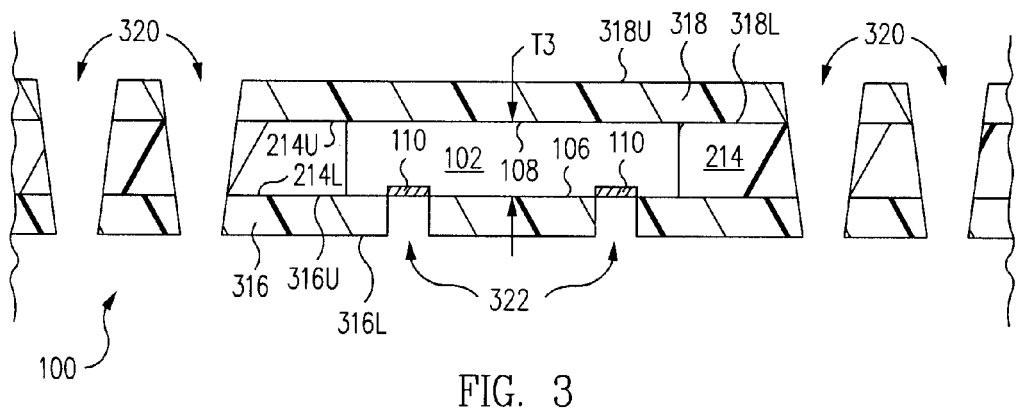

FIG. 3 is a cross-sectional view of fan out buildup substrate stackable package 100 of FIG. 2 at a later stage during fabrication in accordance with one embodiment. Referring now to FIGS. 2 and 3 together, package body 214 is ground down from upper surface 214U to expose inactive surface 108 of electronic component 102. In one embodiment, inactive surface 108 is also ground down thus thinning both package body 214 and electronic component 102.

After thinning, upper surface 214U of package body 214 and inactive surface 108 of electronic component 102 are parallel and coplanar. Although various features may be described as being parallel, coplanar, perpendicular, or having other relationships, in light of this disclosure, those of skill in the art will understand that the features may not be exactly parallel, coplanar, perpendicular, but only substantially parallel, coplanar, perpendicular to within accepted manufacturing tolerances.

Further, after grinding, package body 214 and electronic component 102 have an equal thickness T3 less than thicknesses T1, T2 prior to grinding. Thinning package body 214 and electronic component 102 minimizes the overall thickness of fan out buildup substrate stackable package 100. Generally, fan out buildup substrate stackable package 100 is extremely thin resulting in extremely thin stacked assemblies. Grinding of package body 214 and electronic component 102 is optional, and in one embodiment, is not performed.

Package body 214 is a relatively rigid material allowing carrier 104 (FIG. 2) to be removed as illustrated in FIG. 3. In various embodiments, carrier 104 is removed by peeling, etching, grinding, or other removal technique.

Referring now to FIG. 3, a first die side buildup dielectric layer 316 is applied to lower surface 214L of package body 214 and active surface 106 of electronic component 102 including bond pads 110. More particularly, an upper, e.g., first, surface 316U is applied to lower surface 214L of package body 214 and active surface 106 of electronic component 102. First die side buildup dielectric layer 316 further includes a lower, e.g., second, surface 316L.

Further, a first mold side buildup dielectric layer 318 is applied to upper surface 214U of package body 214. In the case where inactive surface 108 of electronic component 102 is exposed, first mold side buildup dielectric layer 318 is also applied to inactive surface 108. More particularly, a lower, e.g., first, surface 318L of first mold side buildup dielectric layer 318 is applied to upper surface 214U of package body 214 and inactive surface 108 of electronic component 102. First mold side buildup dielectric layer 318 further includes an upper, e.g., second, surface 318U.

As further illustrated in FIG. 3, after first die side buildup dielectric layer 316 and first mold side buildup dielectric layer 318 are applied, mold side to die side via apertures 320 are formed. Via apertures 320 extend entirely through first mold side buildup dielectric layer 318, package body 214, and first die side buildup dielectric layer 316. In one embodiment, via apertures 320 are formed by laser ablating through first mold side buildup dielectric layer 318, package body 214, and first die side buildup dielectric layer 316.

Further, bond pad via apertures 322 are formed e.g., using laser ablation, entirely through first die side buildup dielectric layer 316. Bond pad via apertures 322 extend through first die side buildup dielectric layer 316 and to bond pads 110. Bond pads 110 are exposed through bond pad via apertures 322.

Figure 4:
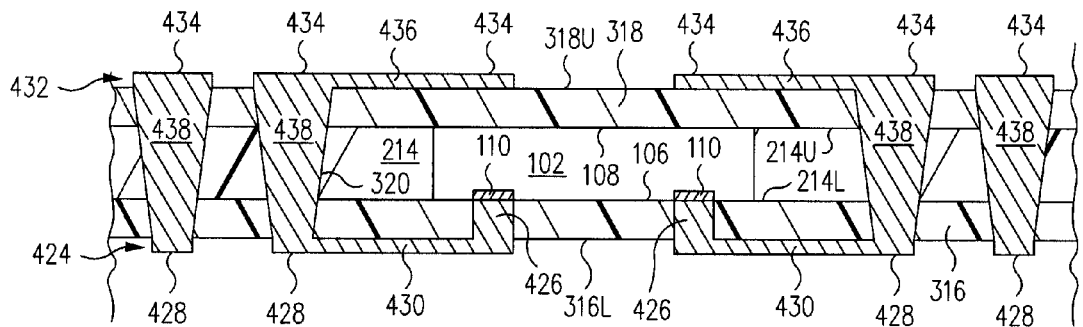

FIG. 4 is a cross-sectional view of fan out buildup substrate stackable package 100 of FIG. 3 at a later stage during fabrication in accordance with one embodiment. Referring now to FIGS. 3 and 4 together, an electrically conductive first die side circuit pattern 424 is formed. First die side circuit pattern 424 is sometimes called a redistribution layer (RDL).

First die side circuit pattern 424 includes electrically conductive bond pad vias 426 formed within bond pad via apertures 322. Bond pad vias 426 are electrically connected to bond pads 110.

First die side circuit pattern 424 further includes electrically conductive lands 428 and electrically conductive traces 430. In accordance with this embodiment, lands 428 and traces 430 are formed on lower surface 316L of first die side buildup dielectric layer 316. Traces 430 electrically connect bond pad vias 426 with lands 428.

Further, an electrically conductive first mold side circuit pattern 432 is formed. First mold side circuit pattern 432 includes electrically conductive lands 434 and electrically conductive traces 436. In accordance with this embodiment, lands 434 and traces 436 are formed on upper surface 318U of first mold side buildup dielectric layer 318. Traces 436 are electrically connected to lands 434.

In one embodiment, first mold side circuit pattern 432 includes shielding regions, e.g., relatively large regions of planar electrically conductive material that shields electronic component 102.

Further, electrically conductive mold side to die side through vias 438 are formed in via apertures 320 and extend entirely through first mold side buildup dielectric layer 318, package body 214, and first die side buildup dielectric layer 316. Through vias 438 electrically connect first die side circuit pattern 424, e.g., lands 428 thereof, to first mold side circuit pattern 432, e.g., lands 434 thereof.

In one embodiment, first die side circuit pattern 424, first mold side circuit pattern 432, and through vias 438 are simultaneously formed by plating an electrically conductive material such as copper. In one embodiment, lower and upper resists are applied to first die side buildup dielectric layer 316 and first mold side buildup dielectric layer 318 and patterned to form circuit pattern artifacts therein, e.g., positive images of first die side circuit pattern 424 and first mold side circuit pattern 432. The circuit pattern artifacts formed within the upper and lower resists as well as via apertures 320 are filled with the electrically conductive material to form first die side circuit pattern 424, first mold side circuit pattern 432, and through vias 438.

In another embodiment, an electrically conductive material is plated to fill via apertures 320 and to cover first die side buildup dielectric layer 316 and first mold side buildup dielectric layer 318. The electrically conductive material on first die side buildup dielectric layer 316 and first mold side buildup dielectric layer 318 is then selectively etched to form first die side circuit pattern 424 and first mold side circuit pattern 432, respectively.

As set forth above, first die side circuit pattern 424, e.g., lands 428 and traces 430 thereof, is formed on lower surface 316L of first die side buildup dielectric layer 316. Similarly, first mold side circuit pattern 432, e.g., lands 434 and traces 436 thereof, is formed on upper surface 318U of first mold side buildup dielectric layer 318.

However, in another embodiment, first die side circuit pattern 424, e.g., lands 428 and traces 430 thereof, is embedded into first die side buildup dielectric layer 316 at lower surface 316L. Similarly, first mold side circuit pattern 432, e.g., lands 434 and traces 436 thereof, is embedded into first mold side buildup dielectric layer 318 at upper surface 318U. Generally, first die side circuit pattern 424 contacts first die side buildup dielectric layer 316 and first mold side circuit pattern 432 contacts first mold side buildup dielectric layer 318.

In accordance with this embodiment, circuit pattern artifacts, e.g., positive images of first die side circuit pattern 424 and first mold side circuit pattern 432, are formed in first die side buildup dielectric layer 316 at lower surface 316L and in first mold side buildup dielectric layer 318 at upper surface 318U, respectively. The circuit pattern artifacts are formed using laser ablation, for example.

The circuit pattern artifacts formed within first die side buildup dielectric layer 316 and in first mold side buildup dielectric layer 318 as well as via apertures 320 are filled with the electrically conductive material to form first die side circuit pattern 424, first mold side circuit pattern 432, and through vias 438. First die side circuit pattern 424 and first mold side circuit pattern 432 are embedded within first die side buildup dielectric layer 316 and first mold side buildup dielectric layer 318, respectively.

In another embodiment, one or more of first die side circuit pattern 424, first mold side circuit pattern 432, and through vias 438 are formed in separate operations.

In yet another embodiment, first mold side buildup dielectric layer 318 is not formed. In accordance with this embodiment, first mold side circuit pattern 432 is formed directly on upper surface 214U of package body 214 and on inactive surface 108 of electronic component 102 in the case where inactive surface 108 is exposed.

As illustrated in FIG. 4, through vias 438 completely fill via apertures 320. In accordance with this embodiment, through vias 438 are formed in a single plating operation which fills via apertures 320 with electrically conductive material to form through vias 438. However, as discussed below in reference to FIG. 5, in another embodiment, via apertures 320 are filled in two or more operations.

Figure 5:
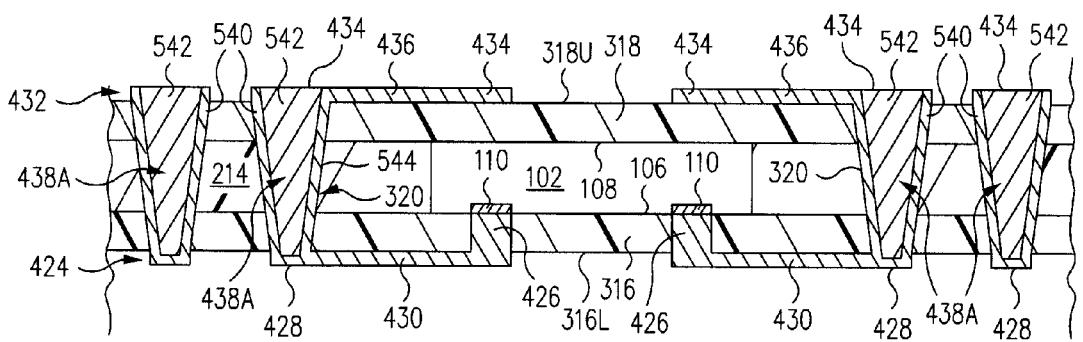
FIG. 5 is a cross-sectional view of the fan out buildup substrate stackable package of FIG. 3 at a later stage during fabrication in accordance with another embodiment.

FIG. 5 is a cross-sectional view of fan out buildup substrate stackable package 100 of FIG. 3 at a later stage during fabrication in accordance with another embodiment. Referring now to FIGS. 3 and 5 together, in accordance with this embodiment, through vias 438A include electrically conductive sidewall layers 540 and electrically conductive fillings 542.

Sidewall layers 540 are formed directly on sidewalls 544 of via apertures 320. Illustratively, sidewall layers 540 are formed, e.g., by plating, simultaneously with first die side circuit pattern 424 and/or first mold side circuit pattern 432. Sidewall layers 540 do not completely fill via apertures 320 such that voids exist within sidewall layers 540. These voids are filled with fillings 542. Illustratively, fillings 542 are formed of electrically conductive solder, adhesive, or other electrically conductive material.

Although through vias 438 similar to through vias 438 of FIG. 4 are illustrated in the remaining figures, in light of this disclosure, those of skill in the art will understand that through vias similar to through vias 438A of FIG. 5 are used in alternative embodiments.

Figure 6:
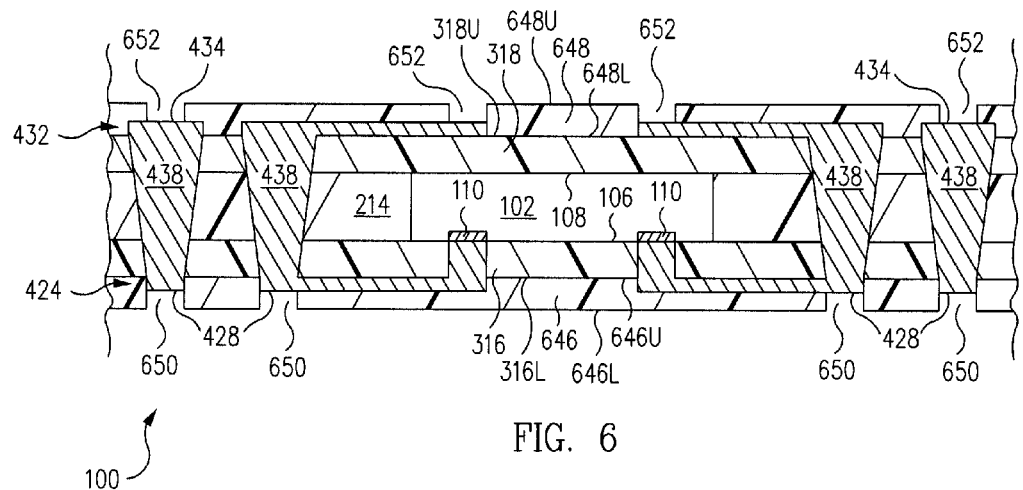
FIGS. 6, 7, 8 are cross-sectional views of the fan out buildup substrate stackable package of FIG. 4 at later stages during fabrication in accordance with various embodiments.

FIG. 6 is a cross-sectional view of fan out buildup substrate stackable package 100 of FIG. 4 at a later stage during fabrication in accordance with another embodiment. Referring now to FIG. 6, a second die side buildup dielectric layer 646 is applied to lower surface 316L of first die side buildup dielectric layer 316 and to first die side circuit pattern 424.

More particularly, an upper, e.g., first, surface 646U of second die side buildup dielectric layer 646 is applied to lower surface 316L of first die side buildup dielectric layer 316 and first die side circuit pattern 424. Second die side buildup dielectric layer 646 further includes a lower, e.g., second, surface 646L.

Further, a second mold side buildup dielectric layer 648 is applied to upper surface 318U of first mold side buildup dielectric layer 318 and to first mold side circuit pattern 432. More particularly, a lower, e.g., first, surface 648L of second mold side buildup dielectric layer 648 is applied to upper surface 318U of first mold side buildup dielectric layer 318 and to first mold side circuit pattern 432. Second mold side buildup dielectric layer 648 further includes an upper, e.g., second, surface 648U.

As further illustrated in FIG. 6, die side blind via apertures 650 are formed in second die side buildup dielectric layer 646. Die side blind via apertures 650 extend entirely through second die side buildup dielectric layer 646 to expose first die side circuit pattern 424, e.g., lands 428 thereof. In one embodiment, die side blind via apertures 650 are formed by laser ablating through second die side buildup dielectric layer 646, although other blind via aperture formation techniques are used in other embodiments.

Similarly, mold side blind via apertures 652 are formed in second mold side buildup dielectric layer 648. Mold side blind via apertures 652 extend entirely through second mold side buildup dielectric layer 648 to expose first mold side circuit pattern 432, e.g., lands 434 thereof. In one embodiment, mold side blind via apertures 652 are formed by laser ablating through second mold side buildup dielectric layer 648, although other blind via aperture formation techniques are used in other embodiments.

Figure 7:
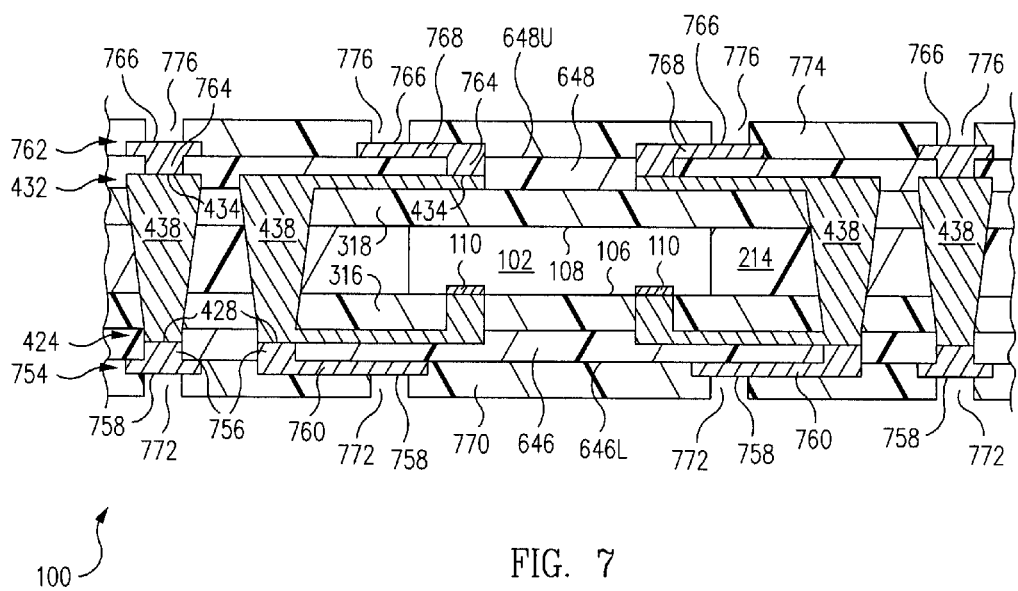

FIG. 7 is a cross-sectional view of fan out buildup substrate stackable package 100 of FIG. 6 at a later stage during fabrication in accordance with another embodiment. Referring now to FIGS. 6 and 7 together, an electrically conductive second die side circuit pattern 754 is formed.

Second die side circuit pattern 754 includes electrically conductive die side blind vias 756 formed within die side blind via apertures 650. Die side blind vias 756 are electrically connected to first die side circuit pattern 424, e.g., lands 428 thereof.

Second die side circuit pattern 754 further includes electrically conductive lands 758 and electrically conductive traces 760. In accordance with this embodiment, lands 758 and traces 760 are formed on lower surface 646L of second die side buildup dielectric layer 646. Traces 760 electrically connect die side blind vias 756 with lands 758.

Further, an electrically conductive second mold side circuit pattern 762 is formed. Second mold side circuit pattern 762 includes electrically conductive mold side blind vias 764 formed within mold side blind via apertures 652. Mold side blind vias 764 are electrically connected to first mold side circuit pattern 432, e.g., lands 434 thereof.

Second mold side circuit pattern 762 further includes electrically conductive lands 766 and electrically conductive traces 768. In accordance with this embodiment, lands 766 and traces 768 are formed on upper surface 648U of second mold side buildup dielectric layer 648. Traces 768 electrically connect mold side blind vias 764 with lands 766.

In one embodiment, second die side circuit pattern 754 and second mold side circuit pattern 762 are simultaneously formed by plating an electrically conductive material such as copper. In one embodiment, lower and upper resists are applied to second die side buildup dielectric layer 646 and second mold side buildup dielectric layer 648 and patterned to form circuit pattern artifacts therein, e.g., positive images of second die side circuit pattern 754 and second mold side circuit pattern 762. The circuit pattern artifacts formed within the upper and lower resists are filled with the electrically conductive material to form second die side circuit pattern 754 and second mold side circuit pattern 762.

In another embodiment, an electrically conductive material is plated to fill blind via apertures 650, 652 and to cover second die side buildup dielectric layer 646 and second mold side buildup dielectric layer 648. The electrically conductive material on second die side buildup dielectric layer 646 and second mold side buildup dielectric layer 648 is then selectively etched to form second die side circuit pattern 754 and second mold side circuit pattern 762, respectively.

As set forth above, second die side circuit pattern 754, e.g., lands 758 and traces 760 thereof, is formed on lower surface 646L of second die side buildup dielectric layer 646. Similarly, second mold side circuit pattern 762, e.g., lands 766 and traces 768 thereof, is formed on upper surface 648U of second mold side buildup dielectric layer 648.

However, in another embodiment, second die side circuit pattern 754, e.g., lands 758 and traces 760 thereof, is embedded into second die side buildup dielectric layer 646 at lower surface 646L. Similarly, second mold side circuit pattern 762, e.g., lands 766 and traces 768 thereof, is embedded into second mold side buildup dielectric layer 648 at upper surface 648U. Generally, second die side circuit pattern 754 contacts second die side buildup dielectric layer 646 and second mold side circuit pattern 762 contacts second mold side buildup dielectric layer 648.

In accordance with this embodiment, circuit pattern artifacts, e.g., positive images of second die side circuit pattern 754 and second mold side circuit pattern 762, are formed in second die side buildup dielectric layer 646 at lower surface 646L and in second mold side buildup dielectric layer 648 at upper surface 648U, respectively. The circuit pattern artifacts are formed using laser ablation, for example.

The circuit pattern artifacts formed within second die side buildup dielectric layer 646 and in second mold side buildup dielectric layer 648 are filled with the electrically conductive material to form second die side circuit pattern 754 and second mold side circuit pattern 762. Second die side circuit pattern 754 and second mold side circuit pattern 762 are embedded within second die side buildup dielectric layer 646 and second mold side buildup dielectric layer 648, respectively.

In another embodiment, second die side circuit pattern 754 and second mold side circuit pattern 762 are formed in separate operations.

Although first die side circuit pattern 424, first mold side circuit pattern 432, second die side circuit pattern 754, and second mold side circuit pattern 762 are set forth as containing particular features, e.g., bond pad vias, lands, traces, and blind vias, in light of this disclosure, those of skill in the art will understand that circuit patterns can be formed with other and/or different features depending on the particular signal routing desired.

As further illustrated in FIG. 7, a dielectric lower solder mask 770 is applied to lower surface 646L of second die side buildup dielectric layer 646. Lower solder mask 770 is patterned to form lower land openings 772 in lower solder mask 770. Lower land openings 772 expose lands 758 of second die side circuit pattern 754.

Similarly, a dielectric upper solder mask 774 is applied to upper surface 648U of second mold side buildup dielectric layer 648. Upper solder mask 774 is patterned to form upper land openings 776 in upper solder mask 774. Upper land openings 776 expose lands 766 of second mold side circuit pattern 762.

Figure 8:
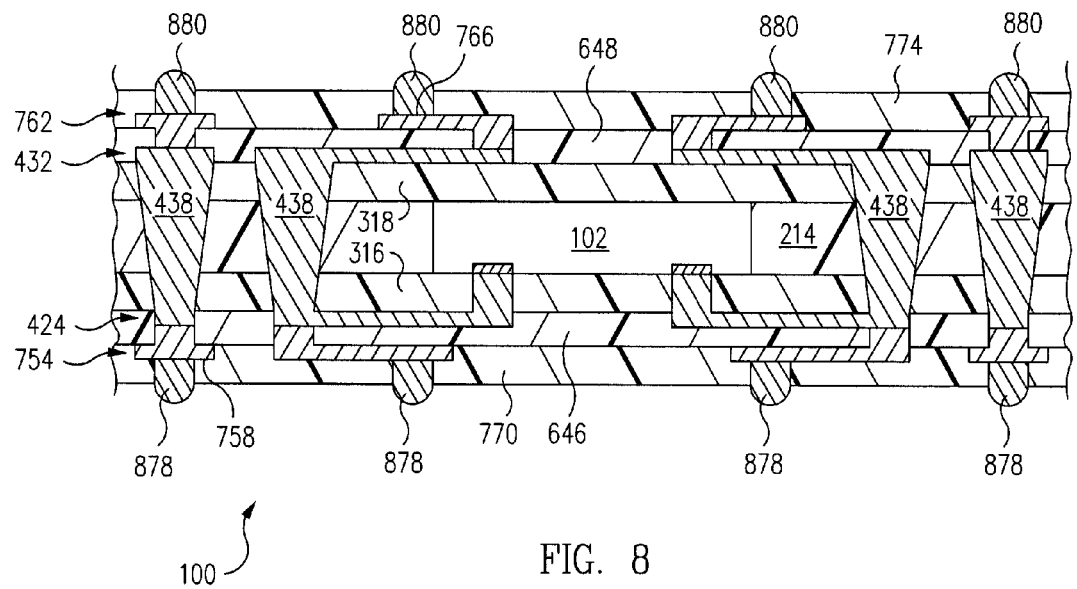

FIG. 8 is a cross-sectional view of fan out buildup substrate stackable package 100 of FIG. 7 at a later stage during fabrication in accordance with another embodiment. Referring now to FIGS. 7 and 8 together, lower interconnection balls 878, e.g., solder, are formed on lands 758 and in lower land opening 772 of lower solder mask 770. Similarly, upper interconnection balls 880, e.g., solder, are formed on lands 766 and in upper land opening 776 of upper solder mask 774.

Interconnection balls 878, 880 are distributed in Ball Grid Arrays (BGAs) in one embodiment. Interconnection balls 878, 880 are reflowed, i.e., heated to a melt and re-solidified, to mount fan out buildup substrate stackable package 100 to another structure such as a printed circuit motherboard and/or to mount stacked devices upon fan out buildup substrate stackable package 100 as discussed further below.

The formation of interconnection balls 878, 880 is optional. In one embodiment, lower interconnection balls 878 are not formed. In another embodiment, upper interconnection balls 880 are not formed. In yet another embodiment, neither lower interconnection balls 878 nor upper interconnection balls 880 are formed.

In one embodiment, a plurality of fan out buildup substrate stackable package 100 are formed simultaneously in an array using the methods as described above. The array is singulated to singulate the individual fan out buildup substrate stackable package 100 from one another.

Figure 9:
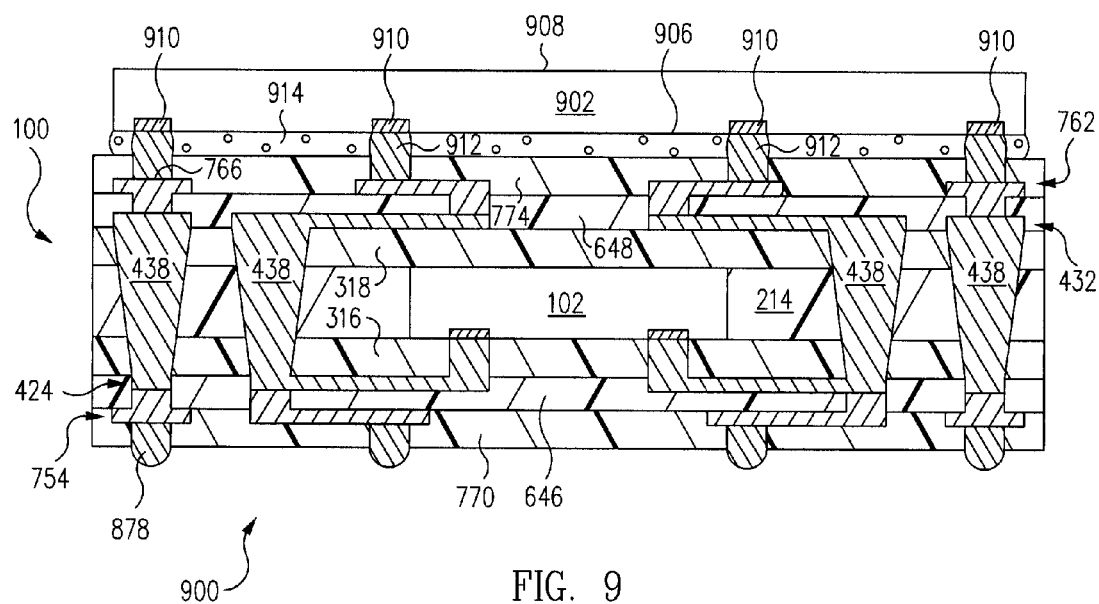
FIGS. 9, 10 are cross-sectional views of stacked assemblies formed with the fan out buildup substrate stackable package of FIG. 8 in accordance with various embodiments.

FIG. 9 is a cross-sectional view of a stacked assembly 900 formed with fan out buildup substrate stackable package 100 of FIG. 8 in accordance with one embodiment. Referring now to FIG. 9, a stacked electronic component 902 is mold side stacked upon fan out buildup substrate stackable package 100.

In one embodiment, stacked electronic component 902 is an integrated circuit chip, e.g., an active component. However, in other embodiments, stacked electronic component 902 is a passive component such as a capacitor, resistor, or inductor. Stacked electronic component 902 is sometimes called a stacked device.

In accordance with this embodiment, stacked electronic component 902 includes an active surface 906 and an opposite inactive surface 908. Stacked electronic component 902 further includes bond pads 910 formed on active surface 906.

Bond pads 910 are flip chip mounted to second mold side circuit pattern 762, e.g., lands 766 thereof, by flip chip bumps 912. Flip chip bumps 912, e.g., solder, are formed by reflowing upper interconnection balls 880 (see FIG. 8) of fan out buildup substrate stackable package 100 in accordance with one embodiment. In another embodiment, bond pads 910 are bumped, e.g., have solder bumps formed thereon, and the solder bumps are reflowed to physically and electrically mount stacked electronic component 902 to second mold side circuit pattern 762.

Optionally, an underfill 914 is applied between active surface 906 of stacked electronic component 902 and upper solder mask 774 and around flip chip bumps 912.

Figure 10:
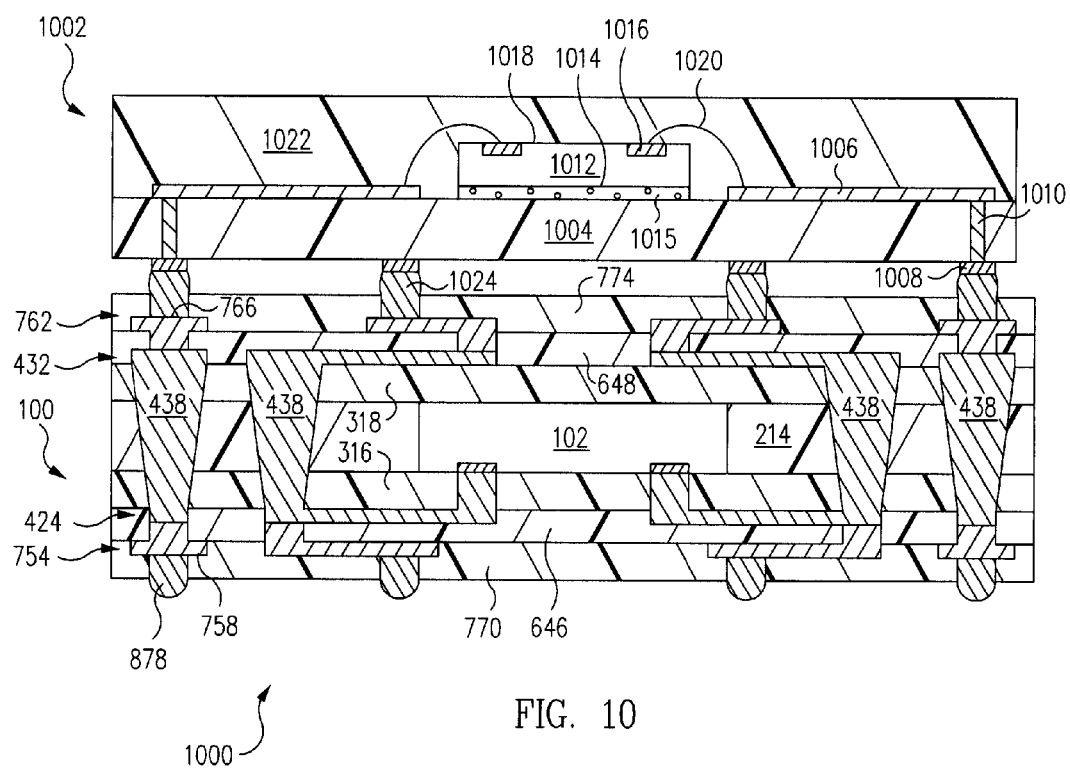

FIG. 10 is a cross-sectional view of a stacked assembly 1000 formed with fan out buildup substrate stackable package 100 of FIG. 8 in accordance with one embodiment. Referring now to FIG. 10, a stacked electronic component package 1002 is mold side stacked upon fan out buildup substrate stackable package 100. Stacked electronic component package 1002 is sometimes called a stacked device.

In accordance with this embodiment, stacked electronic component package 1002 includes a substrate 1004 having upper traces 1006 and lower traces 1008 formed thereon. Upper traces 1006 are electrically connected to lower traces 1008 through substrate 1004 by vias 1010.

An electronic component 1012, e.g., an integrated circuit die, has an inactive surface 1014 mounted to substrate 1004, e.g. with an adhesive 1015. Bond pads 1016 on an active surface 1018 of electronic component 1012 are electrically connected to upper traces 1006 by electrically conductive bond wires 1020. Electronic component 1012, bond wires 1020, and the exposed surface of substrate 1004 are enclosed in a package body 1022, e.g., encapsulant.

Lower traces 1008, e.g., lands thereof, are physically and electrically mounted to second mold side circuit pattern 762, e.g., lands 766 thereof, by interconnection bumps 1024. Interconnection bumps 1024, e.g., solder, are formed by reflowing upper interconnection balls 880 (see FIG. 8) of fan out buildup substrate stackable package 100 in accordance with one embodiment. In another embodiment, stacked electronic component package 1002 is a wirebond Ball Grid Array (BGA) package, e.g., has solder bumps formed thereon, and the solder bumps are reflowed to mount stacked electronic component package 1002 to second mold side circuit pattern 762.

As set forth above, in one embodiment, stacked electronic component package 1002 is a wirebond BGA package. However, in other embodiments, other stacked electronic component packages are stacked upon fan out buildup substrate stackable package 100. Illustratively, a stacked electronic component package includes a plurality of integrated circuit dies stacked one upon another. In another embodiment, a stacked electronic component package includes an electronic component mounted in a flip chip configuration. Further, a stacked electronic component package can include any one of a number of different types to substrates, e.g., lead frame, Land Grid Array (LGA), or other substrates. Accordingly, the particular type of stacked electronic component package stacked upon fan out buildup substrate stackable package 100 is not essential to this embodiment.

Figure 11:
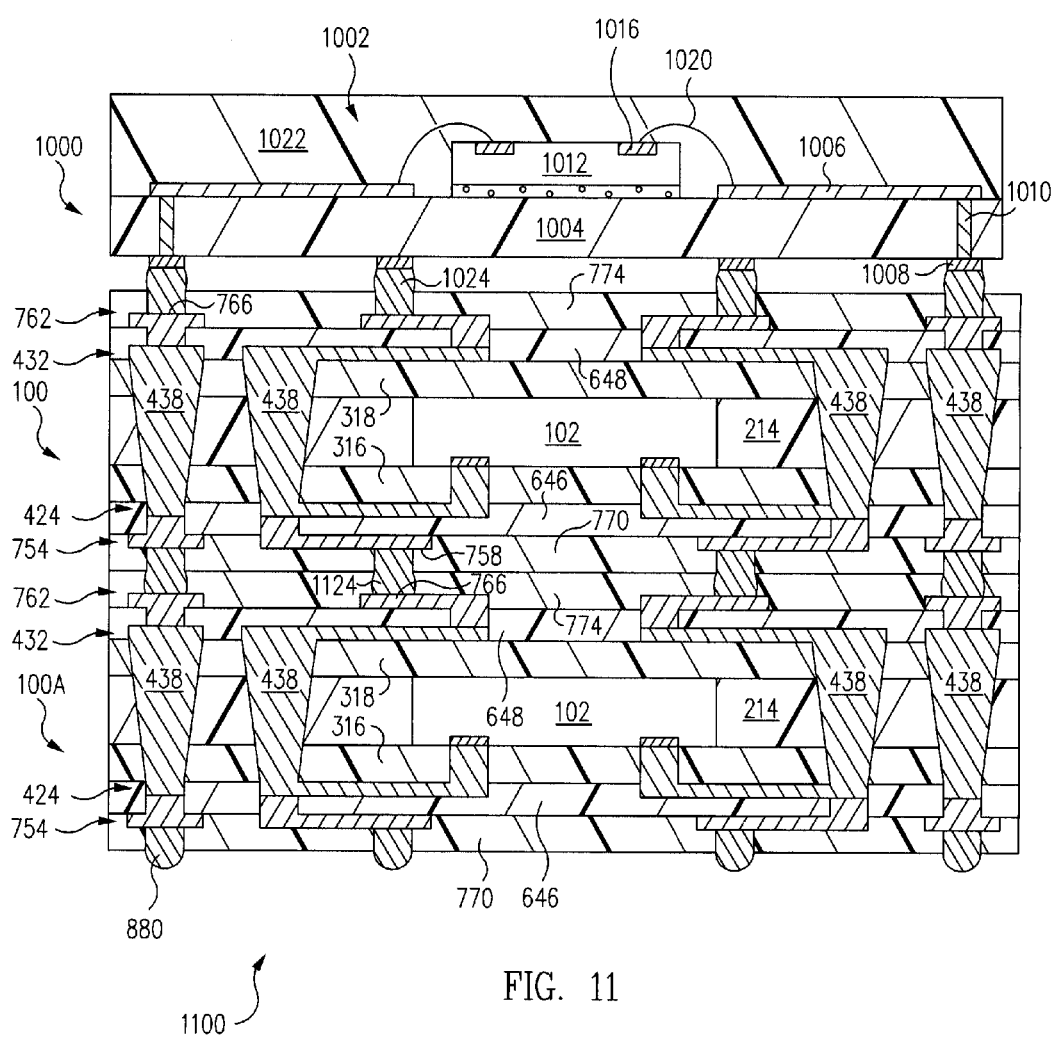
FIG. 11 is a cross-sectional view of a stacked assembly formed with two fan out buildup substrate stackable packages in accordance with one embodiment.

FIG. 11 is a cross-sectional view of a stacked assembly 1100 formed with two fan out buildup substrate stackable packages 100, 100A in accordance with one embodiment. In accordance with this embodiment, referring now to FIGS. 10 and 11 together, stacked assembly 1000 of FIG. 10 is stacked upon a lower, e.g., second, fan out buildup substrate stackable package 100A.

Lower fan out buildup substrate stackable package 100A is similar or identical to fan out buildup substrate stackable package 100 of FIG. 8. Stacked assembly 1000 is similar or identical to stacked assembly 1000 of FIG. 10 and includes fan out buildup substrate stackable package 100 and stacked electronic component package 1002. In accordance with this embodiment, fan out buildup substrate stackable package 100 is sometimes called an upper, e.g., first, fan out buildup substrate stackable package.

Referring now to FIG. 11, lands 758 of second die side circuit pattern 754 of upper fan out buildup substrate stackable package 100 are mounted to lands 766 of second mold side circuit pattern 762 of lower fan out buildup substrate package 100A by interconnection bumps 1124. Interconnection bumps 1124, e.g., solder, are formed by reflowing upper interconnection balls 880 (see FIG. 8) of fan out buildup substrate stackable package 100A and/or interconnection balls 878 (see FIG. 8) of fan out buildup substrate stackable package 100 in accordance with various embodiments. In this manner, upper fan out buildup substrate stackable package 100 is stacked upon lower fan out buildup substrate package 100A.

Although stacked assembly 1100 includes two fan out buildup substrate stackable packages 100, 100A, in other embodiments, more than two fan out buildup substrate stackable packages are stacked upon one another.

Figure 12:
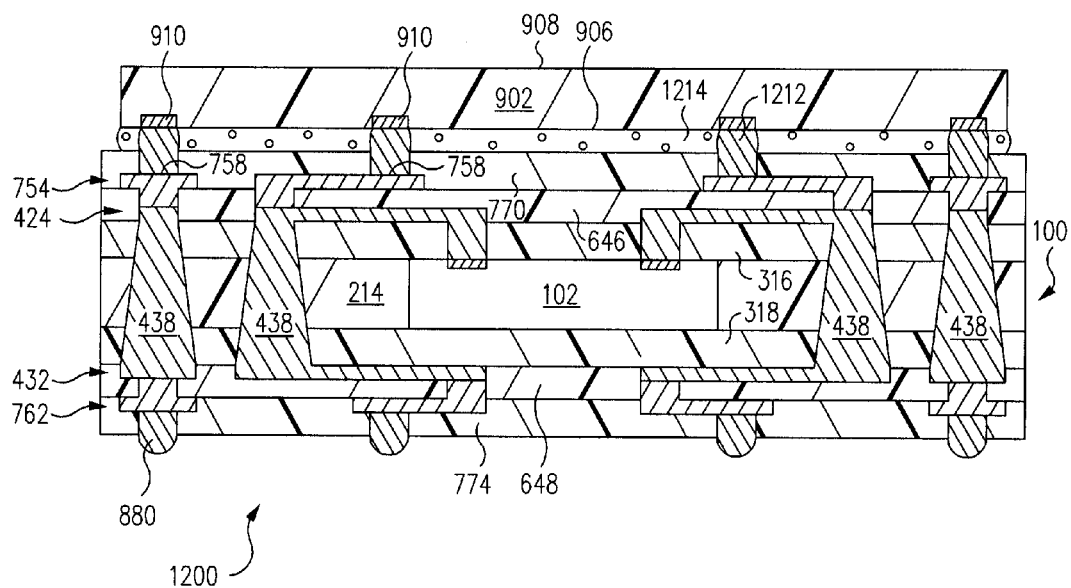
FIGS. 12, 13 are cross-sectional views of stacked assemblies formed with the fan out buildup substrate stackable package of FIG. 8 in accordance with various embodiments.

FIG. 12 is a cross-sectional view of a stacked assembly 1200 formed with fan out buildup substrate stackable package 100 of FIG. 8 in accordance with one embodiment. Referring now to FIGS. 9 and 12 together, stacked assembly 1200 of FIG. 12 is similar to stacked assembly 900 of FIG. 9 and only the significant differences between stacked assemblies 1200, 900 are set forth below.

In accordance with this embodiment, fan out buildup substrate stackable package 100 is inverted from the view of FIG. 9 such that lands 758 of second die side circuit pattern 754 are oriented upwards. In accordance with this embodiment, bond pads 910 of electronic component 902 are flip chip physically and electrically mounted to second die side circuit pattern 754, e.g., lands 758 thereof, by flip chip bumps 1212. Flip chip bumps 1212, e.g., solder, are formed by reflowing lower interconnection balls 878 (see FIG. 8) of fan out buildup substrate stackable package 100 in accordance with one embodiment. In another embodiment, bond pads 910 are bumped, e.g., have solder bumps formed thereon, and the solder bumps are reflowed to physically and electrically mount stacked electronic component 902 to second die side circuit pattern 754.

Optionally, an underfill 1214 is applied between active surface 906 of stacked electronic component 902 and lower solder mask 770 and around flip chip bumps 1212.

Figure 13:
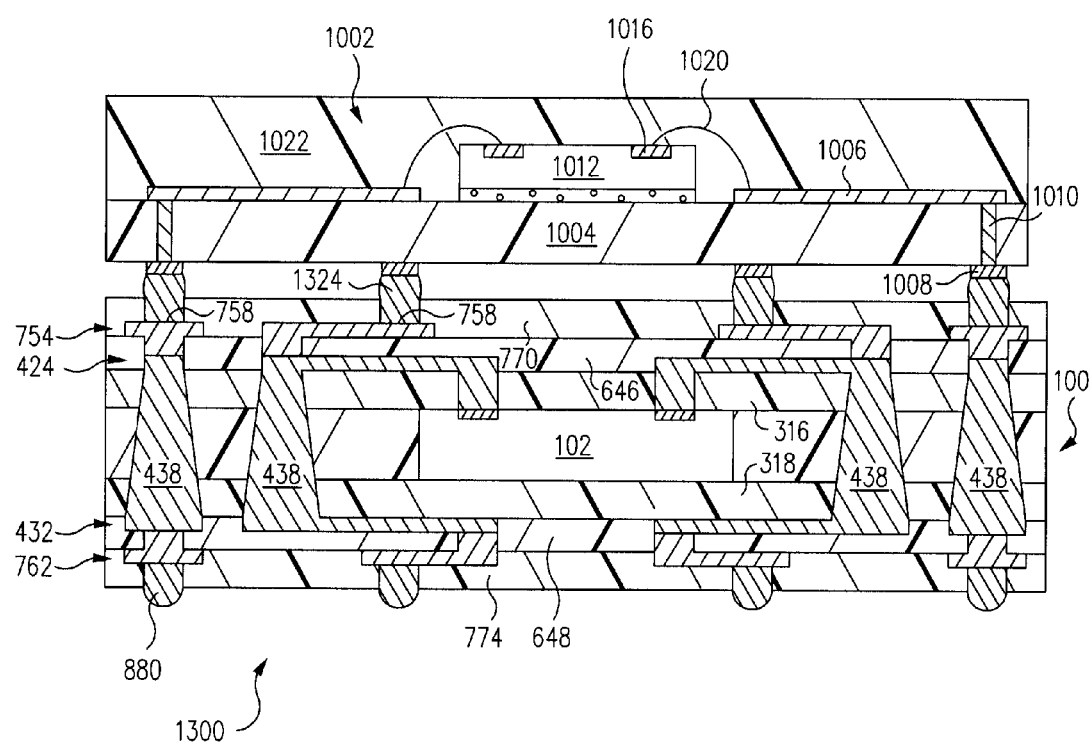

FIG. 13 is a cross-sectional view of a stacked assembly 1300 formed with fan out buildup substrate stackable package 100 of FIG. 8 in accordance with one embodiment. Referring now to FIGS. 10 and 13 together, stacked assembly 1300 of FIG. 13 is similar to stacked assembly 1000 of FIG. 10 and only the significant differences between stacked assemblies 1300, 1000 are set forth below.

In accordance with this embodiment, fan out buildup substrate stackable package 100 is inverted from the view of FIG. 10 such that lands 758 of second die side circuit pattern 754 are oriented upwards. Lower traces 1008, e.g., lands thereof, of stacked electronic component package 1002 are physically and electrically mounted to second die side circuit pattern 754, e.g., lands 758 thereof, by interconnection bumps 1324. Interconnection bumps 1324, e.g., solder, are formed by reflowing lower interconnection balls 878 (see FIG. 8) of fan out buildup substrate stackable package 100 in accordance with one embodiment. In another embodiment, stacked electronic component package 1002 is a wirebond Ball Grid Array (BGA) package, e.g., has solder bumps formed thereon, and the solder bumps are reflowed to mount stacked electronic component package 1002 to second die side circuit pattern 754.

FIGS. 9, 10, 11, 12, and 13 provide examples of stacked assemblies formed with fan out buildup substrate stackable package 100 and stacked devices stacked thereon. Although particular examples are set forth above, in light of this disclosure, those of skill in the art will understand that any one of a number of stacked assemblies can be formed using fan out buildup substrate stackable package 100 depending upon the particular stacked configuration desired. Fan out buildup substrate stackable package 100 provides high density interconnects on both sides providing maximum flexibility in allowing additional devices to be stacked thereon.

Figure 14:
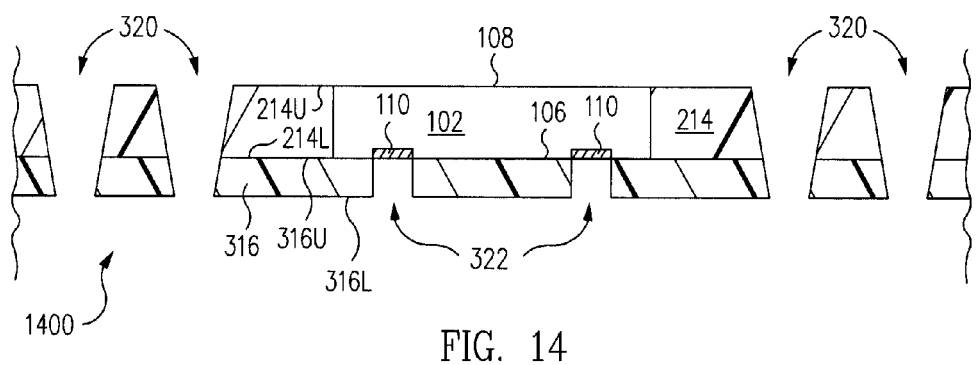
FIG. 14 is a cross-sectional view of a fan out buildup substrate stackable package during fabrication in accordance with another embodiment.

FIG. 14 is a cross-sectional view of a fan out buildup substrate stackable package 1400 during fabrication in accordance with another embodiment. Fan out buildup substrate stackable package 1400 of FIG. 14 is similar to fan out buildup substrate stackable package 100 of FIG. 3 and only the significant differences between fan out buildup substrate stackable packages 1400, 100 are discussed below.

In accordance with this embodiment, first mold side buildup dielectric layer 318 (see FIG. 3) is not applied. Recall that in fan out buildup substrate stackable package 100 of FIG. 3, first mold side buildup dielectric layer 318 was applied to upper surface 214U of package body 214 and to inactive surface 108 of electronic component 102.

Accordingly, referring now to FIG. 14, upper surface 214U and inactive surface 108 (if not covered by package body 214) are exposed to the ambient environment. Further, via apertures 320 extend through package body 214 and first die side buildup dielectric layer 316 only.

Figure 15:
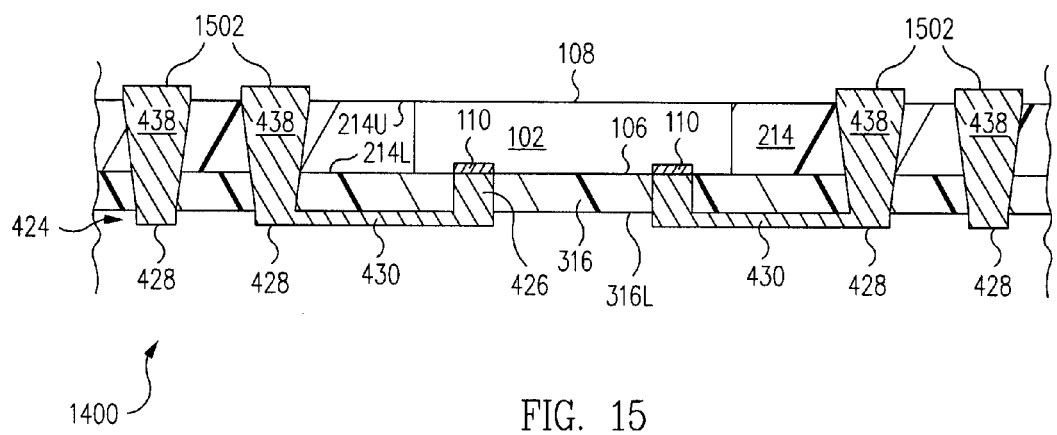
FIGS. 15, 16, 17 are cross-sectional views of the fan out buildup substrate stackable package of FIG. 14 at later stages during fabrication in accordance with various embodiments.

FIG. 15 is a cross-sectional view of fan out buildup substrate stackable package 1400 of FIG. 14 at a later stage during fabrication in accordance with one embodiment. Referring now to FIGS. 14 and 15 together, an electrically conductive first die side circuit pattern 424 is formed. First die side circuit pattern 424 includes bond pad vias 426, lands 428 and traces 430. First die side circuit pattern 424 of FIG. 15 is similar or identical to first die side circuit pattern 424 of FIG. 4, the discussion of which is incorporated herein.

Further, electrically conductive mold side to die side through vias 438 are formed in via apertures 320. Through vias 438 are electrically connected to first die side circuit pattern 424, e.g., lands 428 thereof.

Through vias 438 of FIG. 15 are similar to through vias 438 of FIG. 4, the discussion of which is incorporated herein. However, in accordance with this embodiment, the upper, e.g., first, ends of through vias 438 define mold side lands 1502. In one embodiment, lands 1502 are coplanar and parallel to upper surface 214U of package body 214. In another embodiment, lands 1502 are above or below upper surface 214U of package body 214.

Figure 16:
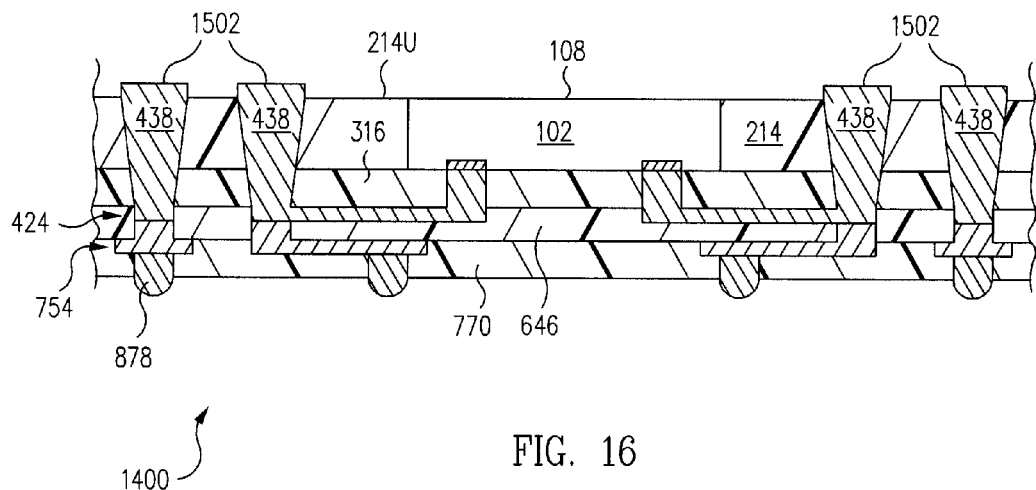

FIG. 16 is a cross-sectional view of fan out buildup substrate stackable package 1400 of FIG. 15 at a later stage during fabrication in accordance with one embodiment. Referring now to FIG. 16, fan out buildup substrate stackable package 1400 includes second die side buildup dielectric layer 646, second die side circuit pattern 754, lower solder mask 770, and, optionally, lower interconnection balls 878.

Second die side buildup dielectric layer 646, second die side circuit pattern 754, lower solder mask 770, and lower interconnection balls 878 of FIG. 16 are similar to second die side buildup dielectric layer 646, second die side circuit pattern 754, lower solder mask 770, and lower interconnection balls 878 of FIG. 8, the discussion of which is incorporated herein.

Figure 17:
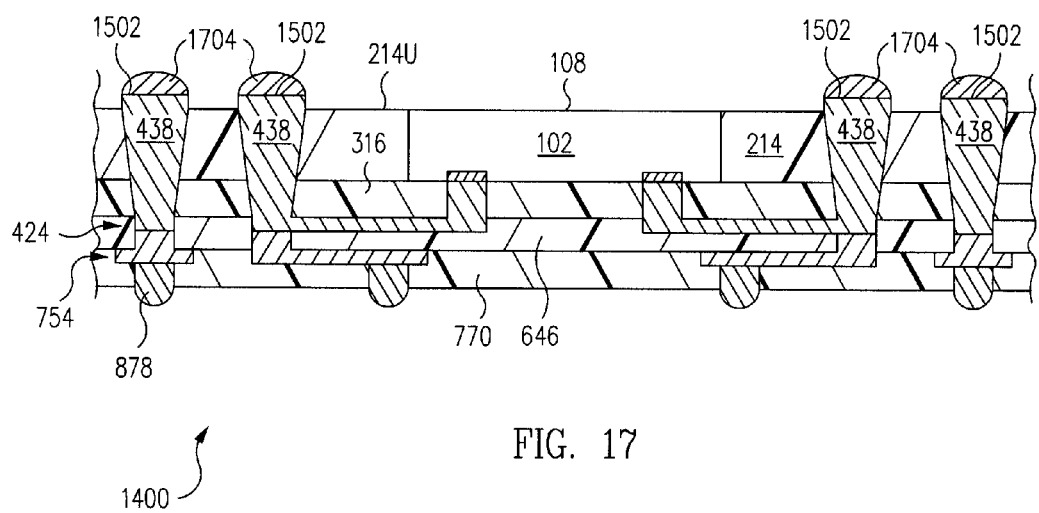

FIG. 17 is a cross-sectional view of fan out buildup substrate stackable package 1400 of FIG. 16 at a later stage during fabrication in accordance with one embodiment. Referring now to FIGS. 16 and 17 together, optionally, interconnection balls 1704, e.g., solder, are formed on lands 1502. Formation of interconnection balls 1704 is optional, and in one embodiment, interconnection balls 1704 are not formed.

Illustratively, solder is applied to lands 1502 and reflowed to form interconnection balls 1704. In one embodiment, through vias 438 are formed of an electrically conductive material, e.g., copper, that is different than the electrically conductive material of interconnection balls 1704, e.g., solder.

In another embodiment, through vias 438 are formed of an electrically conductive material, e.g., solder, that is the same as the electrically conductive material of interconnection balls 1704, e.g., also solder. During the reflow, through vias 438 and interconnection balls 1704 fuse together. Accordingly, although interconnection balls 1704 are set forth as separate structures from through vias 438, in one embodiment, interconnection balls 1704 and through vias 438 are integral, i.e., are a single structure and not a plurality of separate structures mounted together.

Figure 18:
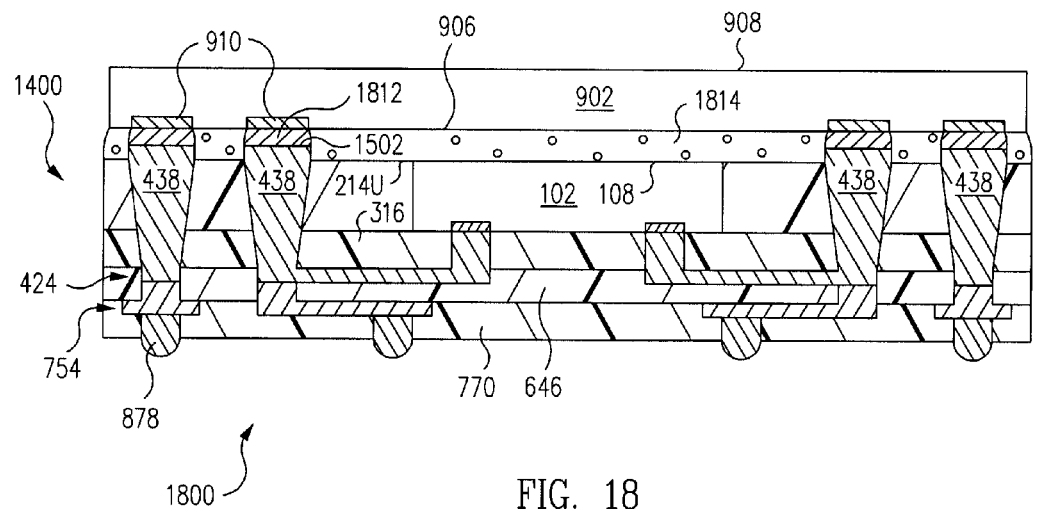
FIG. 18 is a cross-sectional view of a stacked assembly formed with the fan out buildup substrate stackable package of FIG. 17 in accordance with one embodiment.

FIG. 18 is a cross-sectional view of a stacked assembly 1800 formed with fan out buildup substrate stackable package 1400 of FIG. 17 in accordance with one embodiment. Referring now to FIG. 18, stacked electronic component 902 is mold side stacked upon fan out buildup substrate stackable package 1400.

Stacked electronic component 902 of FIG. 18 is similar or identical to stacked electronic component 902 of FIG. 9. In accordance with this embodiment, bond pads 910 are flip chip physically and electrically mounted to through vias 438, e.g., lands 1502 thereof, by flip chip bumps 1812. Flip chip bumps 1812, e.g., solder, are formed by reflowing interconnection balls 1704 (see FIG. 17) of fan out buildup substrate stackable package 1400 in accordance with one embodiment. In another embodiment, bond pads 910 are bumped, e.g., have solder bumps formed thereon, and the solder bumps are reflowed to physically and electrically mount stacked electronic component 902 to lands 1502 of through vias 438.

Optionally, an underfill 1814 is applied between active surface 906 of stacked electronic component 902 and upper surface 214U of package body 214 (and inactive surface 108 of electronic component 102 if exposed) and around flip chip bumps 1812.

Figure 19:
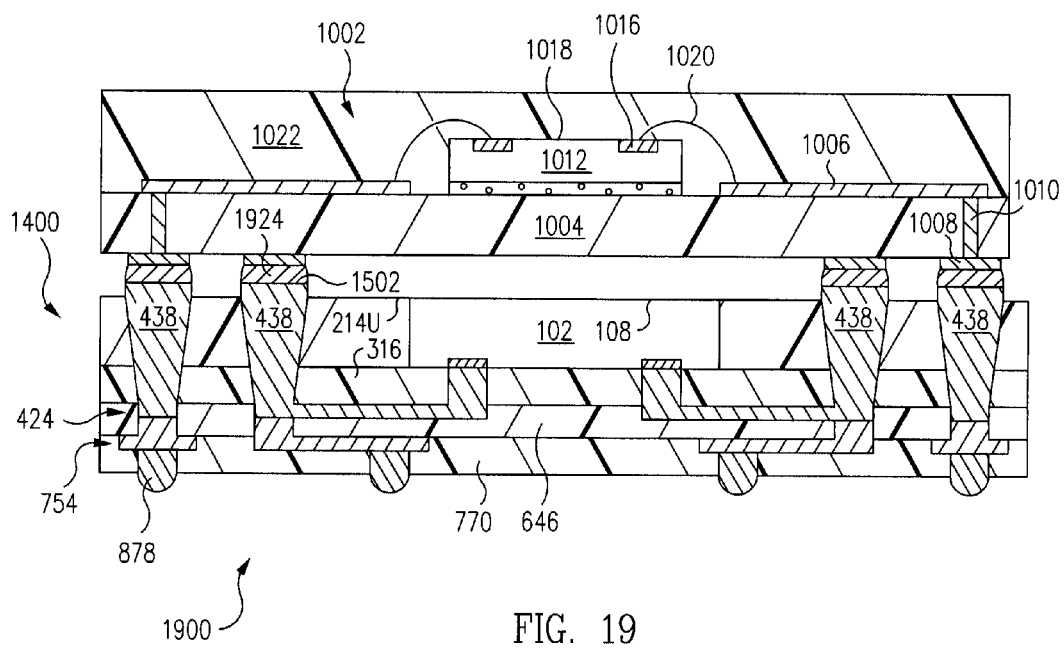
FIG. 19 is a cross-sectional view of a stacked assembly formed with the fan out buildup substrate stackable package of FIG. 17 in accordance with yet another embodiment.

FIG. 19 is a cross-sectional view of a stacked assembly 1900 formed with fan out buildup substrate stackable package 1400 of FIG. 17 in accordance with yet another embodiment. Referring now to FIG. 19, stacked electronic component package 1002 is mold side stacked upon fan out buildup substrate stackable package 1400.

Stacked electronic component package 1002 of FIG. 19 is similar or identical to stacked electronic component package 1002 of FIG. 10. In accordance with this embodiment, lower traces 1008, e.g., lands thereof, of stacked electronic component package 1002 are physically and electrically mounted to through vias 438, e.g., lands 1502 thereof, by interconnection bumps 1924. Interconnection bumps 1924, e.g., solder, are formed by reflowing interconnection balls 1704 (see FIG. 17) of fan out buildup substrate stackable package 1400 in accordance with one embodiment. In another embodiment, stacked electronic component package 1002 is a wirebond Ball Grid Array (BGA) package, e.g., has solder bumps formed thereon, and the solder bumps are reflowed to mount stacked electronic component package 1002 to lands 1502 of through vias 438.

Figure 20:
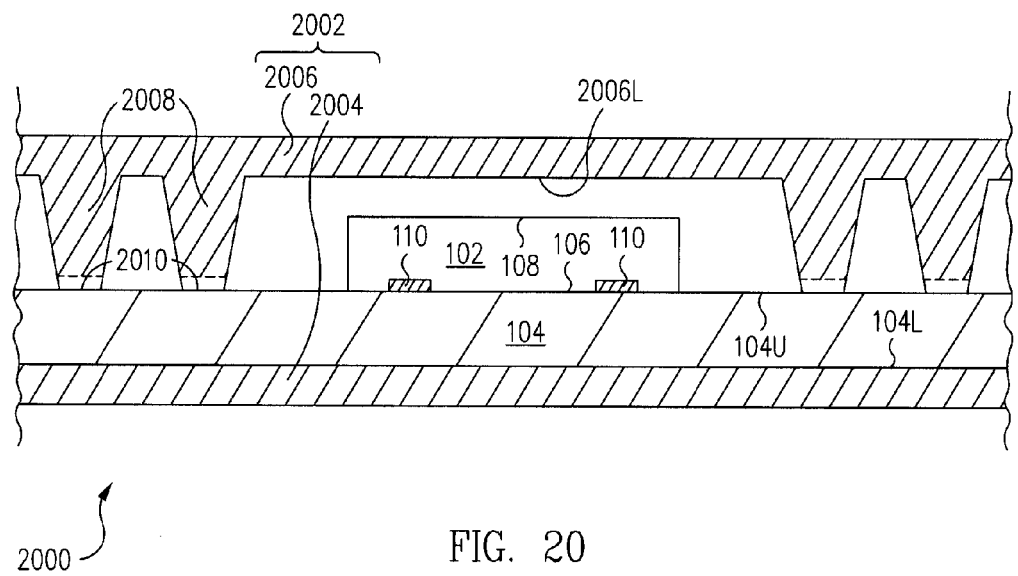
FIG. 20 is a cross-sectional view of a fan out buildup substrate stackable package during fabrication in accordance with another embodiment.

FIG. 20 is a cross-sectional view of a fan out buildup substrate stackable package 2000 during fabrication in accordance with another embodiment. Referring now to FIG. 20, electronic component 102 including carrier 104 are placed within a mold 2002. Mold 2002 includes a lower, e.g., first, mold half 2004 and an upper, e.g., second, mold half 2006. Upper mold half 2006 includes pins 2008 that protrude from a lower, e.g., first, surface 2006L of upper mold half 2006.

Lower surface 104L of carrier 104 is placed on lower mold half 2004. Upper mold half 2006 is then brought down upon carrier 104 and lower mold half 2004 thus enclosing electronic component 102 and carrier 104 within mold 2002.

In accordance with one embodiment, pins 2008 extend from lower surface 2006L of upper mold half 2006 to upper surface 104U of carrier 104. Illustratively, pin ends 2010 of pins 2008 contact carrier 104 thus preventing mold compound from entering the space between pin ends 2010 and carrier 104.

In accordance with another embodiment, as illustrated by the dashed lines, pin ends 2010 are spaced apart and do not contact carrier 104. In accordance with this embodiment, mold compound will enter the space between pin ends 2010 and carrier 104.

In accordance with this embodiment, pins 2008 taper from lower surface 2006L of upper mold half 2006. More particularly, pins 2008 have a maximum diameter at lower surface 2006L of mold half 2006 and gradually diminish in diameter away from lower surface 2006L of upper mold half 2006 to have a minimum diameter at pin ends 2010 of pins 2008.

Forming pins 2008 with a taper facilitates easy removal of pins 2008 from the mold compound as discussed further below with reference to FIGS. 21, 22. However, in another embodiment, pins 2008 do not taper, e.g., are in the shape of uniform diameter cylinders.

Although carrier 104 is set forth, in another embodiment, electronic component 102 is mounted directly to lower mold half 2004, e.g., with adhesive. In this event, pins 2008 contact lower mold half 2004 or are spaced apart from lower mold half 2004 in a manner similar to that discussed above regarding carrier 104.

Figure 21:
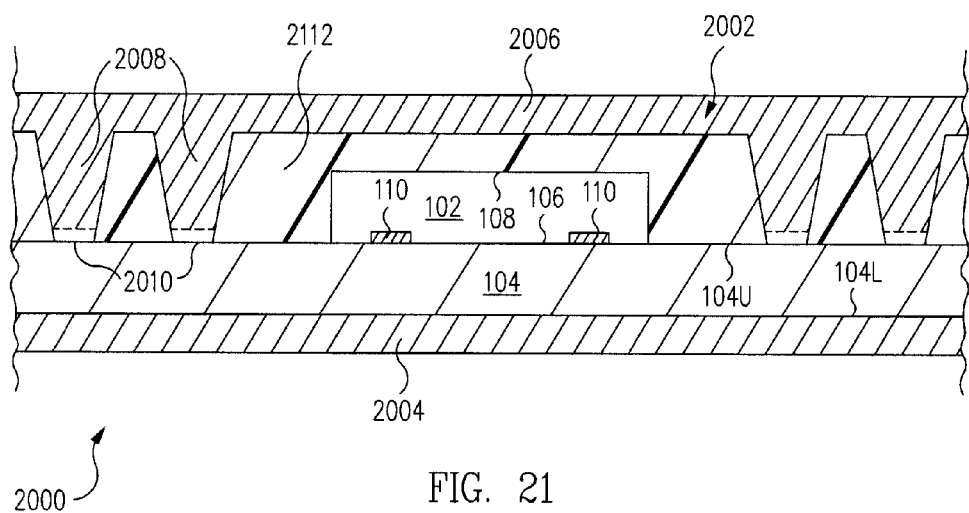
FIGS. 21, 22 are cross-sectional views of the fan out buildup substrate stackable package of FIG. 20 at later stages during fabrication in accordance with various embodiments.

FIG. 21 is a cross-sectional view of fan out buildup substrate stackable package 2000 of FIG. 20 at a later stage during fabrication in accordance with one embodiment. Referring now to FIG. 21, mold compound 2112 is injected into mold 2002. More particularly, mold compound 2112 is injected to enclose electronic component 102, the exposed portion of upper surface 104U of carrier 104, and pins 2008.

Figure 22:
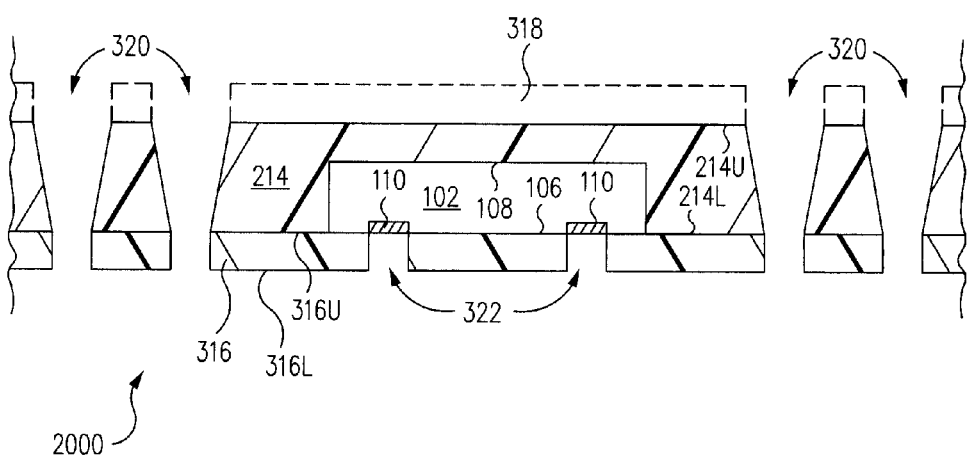

FIG. 22 is a cross-sectional view of fan out buildup substrate stackable package 2000 of FIG. 21 at a later stage during fabrication in accordance with one embodiment. Referring now to FIGS. 21 and 22 together, mold compound 2112 cures, e.g., cools, to form package body 214. More particularly, after curing of mold compound 2112, fan out buildup substrate stackable package 2000 is removed from mold 2002. Removal of pins 2008 from mold compound 2112 forms via apertures 320 within package body 214. More particularly, via apertures 320 are the empty spaces left in mold compound 2112 from removal of pins 2008.

Via apertures 320 extend entirely through package body 214 in the case where pin ends 2010 contact carrier 104. In the case where pin ends 2010 are spaced apart from carrier 104 as indicated by the dashed line in FIG. 21, via apertures 320 extend through most of package body 214 and a small filet of package body 214 covers the lower end of each via aperture 320 at lower surface 214L.

By using mold 2002 with pins 2008, via apertures 320 are formed during the molding process used to form package body 214. In this manner, additional operations, e.g., a laser ablation operation, to form via apertures 320 is avoided thus simplifying manufacturing and reducing the associated cost.

Referring now to FIG. 22, first die side buildup dielectric layer 316 is applied to lower surface 214L of package body 214 and active surface 106 of electronic component 102.

Directly after application, first die side buildup dielectric layer 316 covers and seals the lower ends of via apertures 320. First die side buildup dielectric layer 316 as well as any filets of package body 214 covering via apertures 320 are then patterned, e.g., using laser ablation, to open via apertures 320 such that via apertures 320 extend entirely through package body 214 and first die side buildup dielectric layer 316 as illustrated in FIG. 22. Further, bond pad via apertures 322 are formed. In accordance with one embodiment, processing continues as discussed above in reference to FIGS. 15-17 to complete fabrication of fan out buildup substrate stackable package 2000.

Referring still to FIG. 22, optionally, in addition to first die side buildup dielectric layer 316, first mold side buildup dielectric layer 318 is applied to upper surface 214U of package body 214. Application of first mold side buildup dielectric layer 318 is optional, and so first mold side buildup dielectric layer 318 is indicated by the dashed lines in FIG. 22.

Directly after application, first mold side buildup dielectric layer 318 covers and seals the upper ends of via apertures 320. First mold side buildup dielectric layer 318 is then patterned, e.g., using laser ablation, to open via apertures 320 such that via apertures 320 extend entirely through package body 214 and first mold side buildup dielectric layer 318 as illustrated in FIG. 22. In accordance with one embodiment, processing continues as discussed above in reference to FIGS. 4-8 to complete fabrication of fan out buildup substrate stackable package 2000. Generally, via apertures 320 can be formed using pins 2008 in any of the embodiments set forth herein.

Figure 23:
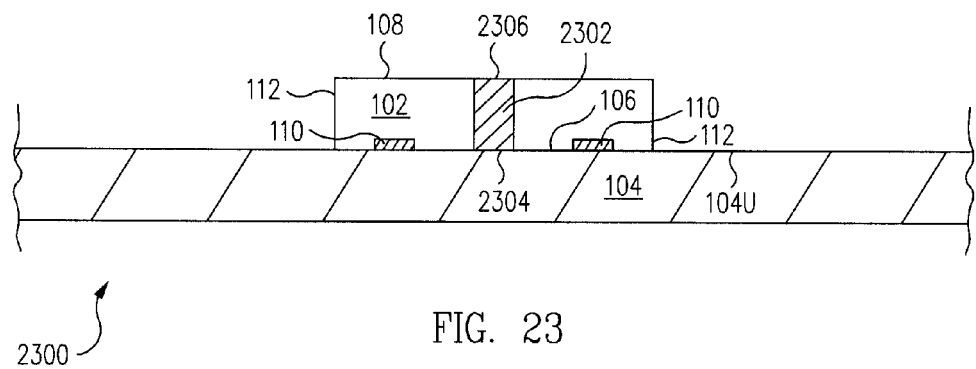
FIG. 23 is a cross-sectional view of a fan out buildup substrate stackable package during fabrication in accordance with another embodiment.

FIG. 23 is a cross-sectional view of a fan out buildup substrate stackable package 2300 during fabrication in accordance with another embodiment. Fan out buildup substrate stackable package 2300 of FIG. 23 is similar to fan out buildup substrate stackable package 100 of FIG. 1 and only the significant differences between fan out buildup substrate stackable package are 2300, 100 are discussed below.

Referring now to FIG. 23, in accordance with this embodiment, electrically conductive through electronic component vias 2302 are formed through electronic component 102.

More particularly, through electronic component vias 2302 extend between active surface 106 and inactive surface 108. The ends of through electronic component vias 2302 at active surface 106 define active surface through via terminals 2304. Further, the ends of through electronic component vias 2302 at inactive surface 108 define inactive surface through via terminals 2306. Active surface through via terminals 2304 are electrically connected to inactive surface through via terminals 2306 by through electronic component vias 2302.

Active surface 106 including bond pads 110 and active surface through via terminals 2304 are mounted to upper surface 104U of carrier 104.

Figure 24:
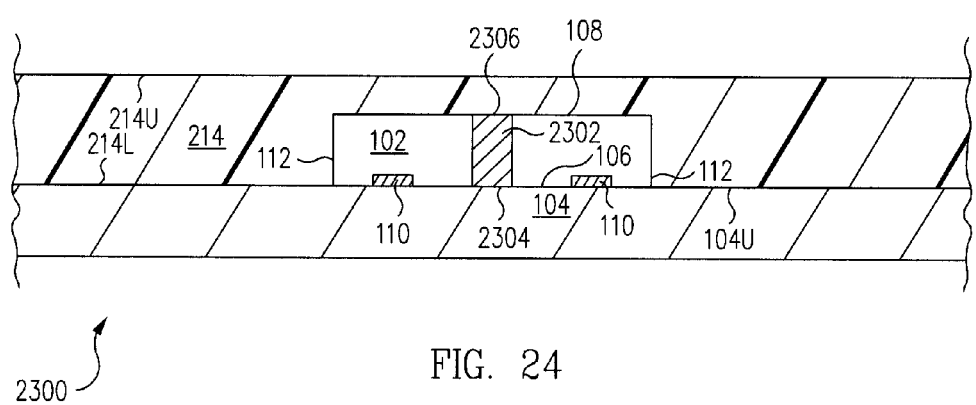
FIGS. 24, 25, 26 are cross-sectional views of the fan out buildup substrate stackable package of FIG. 23 at later stages during fabrication in accordance with various embodiments.

FIG. 24 is a cross-sectional view of fan out buildup substrate stackable package 2300 of FIG. 23 at a later stage during fabrication in accordance with one embodiment. Referring now to FIG. 24, electronic component 102 is encapsulated in dielectric package body 214.

Package body 214 completely encloses electronic component 102 including inactive surface 108, inactive surface through via terminals 2306, sides 112 and the exposed portion of upper surface 104U of carrier 104.

Figure 25:
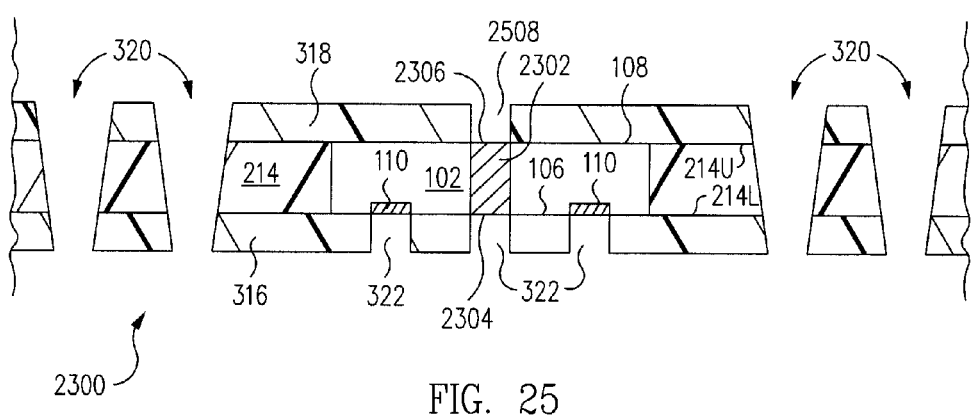

FIG. 25 is a cross-sectional view of fan out buildup substrate stackable package 2300 of FIG. 24 at a later stage during fabrication in accordance with one embodiment. Referring now to FIGS. 24 and 25 together, optionally, package body 214 is ground down from upper surface 214U to expose inactive surface 108 of electronic component 102 and inactive surface through via terminals 2306. As a further option, inactive surface 108 is also ground down thus thinning both package body 214 and electronic component 102. Grinding of package body 214 and electronic component 102 is optional, and in one embodiment, is not performed.

Package body 214 is a relatively rigid material allowing carrier 104 (FIG. 24) to be removed as illustrated in FIG. 25. In various embodiments, carrier 104 is removed by peeling, etching, grinding, or other removal technique.

Referring now to FIG. 25, first die side buildup dielectric layer 316 is applied to lower surface 214L of package body 214 and active surface 106 of electronic component 102 including bond pads 110 and active surface through via terminals 2304. Further, first mold side buildup dielectric layer 318 is applied to upper surface 214U of package body 214. In the case where inactive surface 108 of electronic component 102 is exposed, first mold side buildup dielectric layer 318 is also applied to inactive surface 108.

As further illustrated in FIG. 25, after first die side buildup dielectric layer 316 and first mold side buildup dielectric layer 318 are applied, mold side to die side via apertures 320 are formed.

Further, bond pad via apertures 322 are formed entirely through first die side buildup dielectric layer 316. Bond pad via apertures 322 extend through first die side buildup dielectric layer 316 and to bond pads 110 and also to active surface through via terminals 2304 in accordance with this example. Bond pads 110 and active surface through via terminals 2304 are exposed through bond pad via apertures 322.

Further still, via apertures 2508 are formed entirely through first mold side buildup dielectric layer 318. Via apertures 2508 extend through first mold side buildup dielectric layer 318 and to inactive surface through via terminals 2306. In the case where inactive surface 108 of electronic component 102 is covered by package body 214, via apertures 2508 are also formed through package body 214 and to inactive surface through via terminals 2306. Inactive surface through via terminals 2306 are exposed through via apertures 2508.

Figure 26:
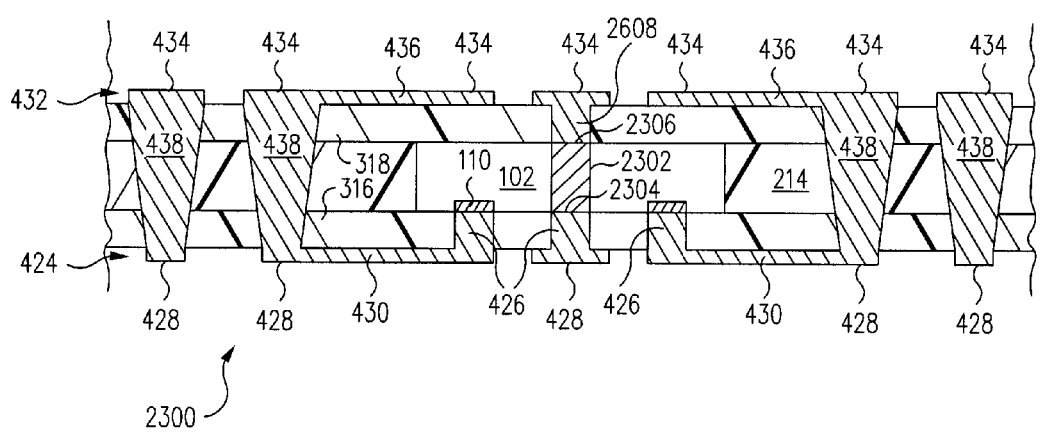

FIG. 26 is a cross-sectional view of fan out buildup substrate stackable package 2300 of FIG. 25 at a later stage during fabrication in accordance with one embodiment. Referring now to FIGS. 25 and 26 together, first die side circuit pattern 424 is formed.

First die side circuit pattern 424 includes bond pad vias 426 formed within bond pad via apertures 322. Bond pad vias 426 are electrically connected to bond pads 110 and also to active surface through via terminals 2304. First die side circuit pattern 424 further includes lands 428 and traces 430.

Further, first mold side circuit pattern 432 is formed. First mold side circuit pattern 432 includes electrically conductive vias 2608. Vias 2608 are formed within via apertures 2508. Vias 2608 are electrically connected to inactive surface through via terminals 2306.

Further, first mold side circuit pattern 432 includes lands 434 and traces 436. Traces 436 are electrically connected to lands 434 and vias 2608. Further, through vias 438 are formed in via apertures 320. In accordance with one embodiment, processing continues as discussed above in reference to FIGS. 4-8 to complete fabrication of fan out buildup substrate stackable package 2300. Generally, any of the embodiments as described herein can be fabricated with through electronic component vias 2302, e.g., with fan out buildup substrate stackable package 2300.

Figure 27:
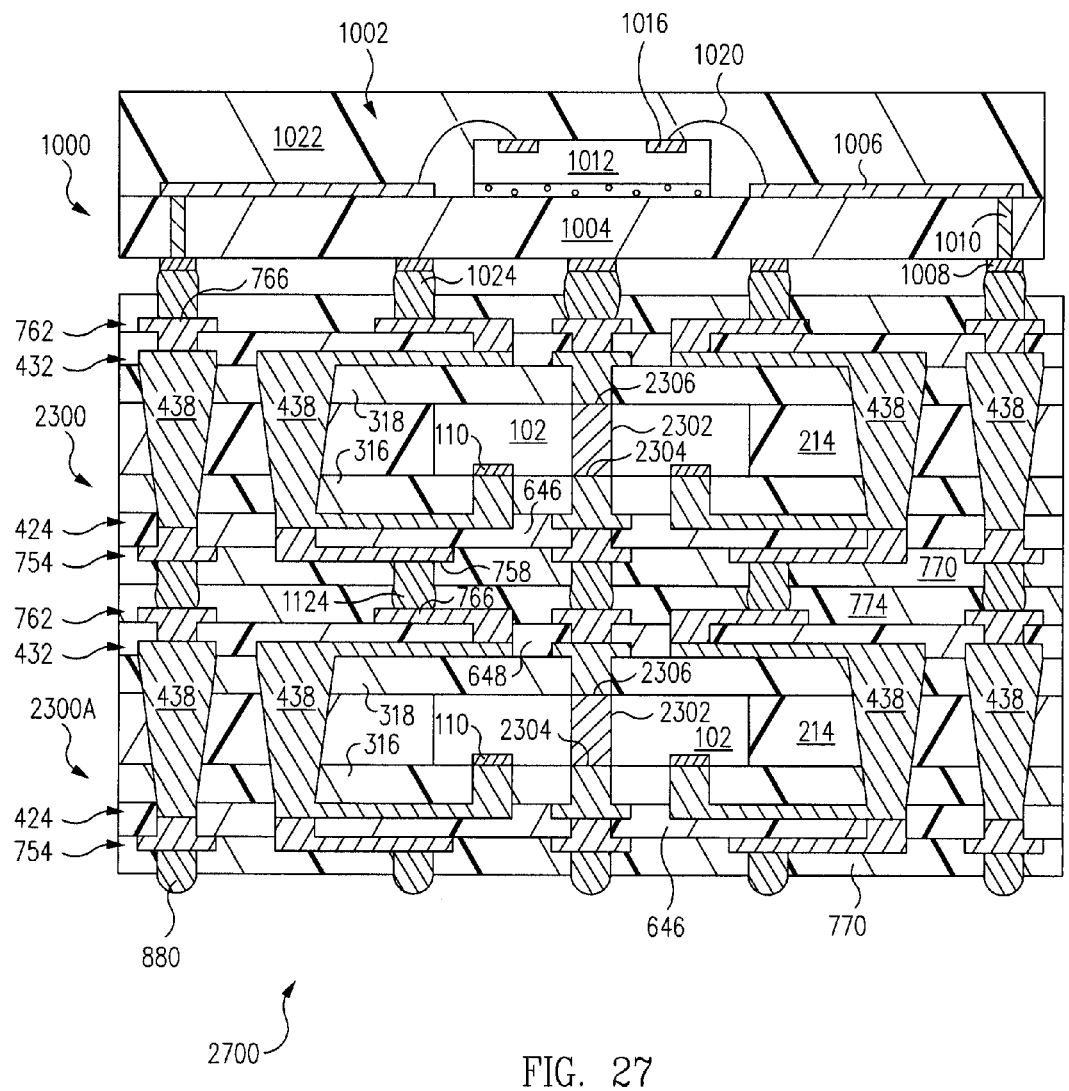
FIG. 27 is a cross-sectional view of a stacked assembly formed with two fan out buildup substrate stackable packages in accordance with one embodiment.

FIG. 27 is a cross-sectional view of a stacked assembly 2700 formed with two fan out buildup substrate stackable packages 2300, 2300A in accordance with one embodiment. Referring now to FIGS. 11, 26, and 27 together, stacked assembly 2700 of FIG. 27 is similar to stacked assembly 1100 of FIG. 11 and only the significant differences are discussed below.

In accordance with this embodiment, stacked assembly 2700 of FIG. 27 is formed with fan out buildup substrate stackable packages 2300, 2300A in place of fan out buildup substrate stackable packages 100, 100A of stacked assembly 1100 of FIG. 11. As discussed above, fan out buildup substrate stackable package 2300 includes through electronic component vias 2302. Fan out buildup substrate stackable package 2300A is similar or identical to fan out buildup substrate stackable package 2300 of FIG. 26 and also includes through electronic component vias 2302.

Although formation of individual packages is described above, in other embodiments, a plurality of packages are formed simultaneously in an array using the methods as described above. The array is singulated to singulate the individual packages from one another. In one embodiment, the plurality of packages are tested while still in an array and prior to singulation. Testing the packages while in an array is more cost effective than testing each package individually after singulation of the array thus minimizing fabrication costs.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A fan out buildup substrate stackable package comprising:
    an electronic component comprising:
        an active surface comprising bond pads;
        sides;
        an inactive surface; and
        through electronic component vias extending through the electronic component between the active surface and the inactive surface of the electronic component, wherein ends of the through electronic component vias at the active surface define active surface through via terminals;
    a package body enclosing the electronic component and directly contacting the sides;
    a first die side buildup dielectric layer applied to the active surface of the electronic component and a first surface of the package body, a second surface of the package body being coplanar with the inactive surface of the electronic component;
    a first die side circuit pattern in contact with the first die side buildup dielectric layer and electrically connected to the bond pads; and
    through vias extending through the package body and the first die side buildup dielectric layer, the through vias being electrically connected to the first die side circuit pattern.

2. The fan out buildup substrate stackable package of claim 1 wherein the first die side circuit pattern comprises:
    bond pad vias extending entirely through the first die side buildup dielectric layer and being electrically connected to the bond pads;
    lands electrically connected to the through vias; and
    traces electrically connecting the bond pad vias to the lands.

3. The fan out buildup substrate stackable package of claim 1 further comprising:
    a second die side buildup dielectric layer applied to the first die side buildup dielectric layer and to the first die side circuit pattern; and
    a second die side circuit pattern in contact with the second die side buildup dielectric layer and electrically connected to the first die side circuit pattern, the second die side circuit pattern comprising lands.

4. The fan out buildup substrate stackable package of claim 1 further comprising:
a first mold side buildup dielectric layer applied to the second surface of the package body; and
a first mold side circuit pattern in contact with the first mold side buildup dielectric layer and electrically connected to the through vias.

5. The fan out buildup substrate stackable package of claim 4 wherein the first mold side circuit pattern comprises: lands electrically connected to the through vias; and traces electrically connected to the lands.

6. The fan out buildup substrate stackable package of claim 4 further comprising:
a second mold side buildup dielectric layer applied to the first mold side buildup dielectric layer and to the first mold side circuit pattern; and
a second mold side circuit pattern in contact with the second mold side buildup dielectric layer and electrically connected to the first mold side circuit pattern, the second mold side circuit pattern comprising lands.

7. The fan out buildup substrate stackable package of claim 1 wherein the through vias comprise:
sidewall layers; and
fillings.

8. The fan out buildup substrate stackable package of claim 1 wherein first ends of the through vias define mold side lands.

9. The fan out buildup substrate stackable package of claim 8 further comprising interconnection balls on the mold side lands.

10. A fan out buildup substrate stackable package comprising:
an electronic component comprising:
an active surface comprising bond pads;
sides;
an inactive surface; and
through electronic component vias extending through the electronic component between the active surface and the inactive surface of the electronic component, wherein ends of the through electronic component vias at the active surface define active surface through via terminals;
a package body enclosing the electronic component and directly contacting the sides and the inactive surface;
a first die side buildup dielectric layer applied to the active surface of the electronic component and a first surface of the package body, a second surface of the package body being above and spaced apart from the inactive surface of the electronic component; a first die side circuit pattern in contact with the first die side buildup dielectric layer and electrically connected to the bond pads; and
through vias extending through the package body and the first die side buildup dielectric layer, the through vias being electrically connected to the first die side circuit pattern.

11. A fan out buildup substrate stackable package comprising:
an electronic component comprising:
an active surface comprising bond pads;
through electronic component vias extending through the electronic component between the active surface and the inactive surface of the electronic component, wherein ends of the through electronic component vias at the active surface define active surface through via terminals; and
inactive surface through via terminals defined by ends of the through electronic component vias at the inactive surface of the electronic component;
a package body enclosing the electronic component;
a first die side buildup dielectric layer applied to the active surface of the electronic component and a first surface of the package body;
a first die side circuit pattern in contact with the first die side buildup dielectric layer and electrically connected to the bond pads and the active surface through via terminals; and
through vias extending through the package body and the first die side buildup dielectric layer, the through vias being electrically connected to the first die side circuit pattern.

12. The fan out buildup substrate stackable package of claim 11 further comprising:
a first mold side buildup dielectric layer applied to a second surface of the package body; and
a first mold side circuit pattern in contact with the first mold side buildup dielectric layer and electrically connected to the inactive surface through via terminals.

13. An assembly comprising:
a fan out buildup substrate stackable package comprising:
an electronic component comprising:
an active surface comprising bond pads;
sides;
an inactive surface; and
through electronic component vias extending through the electronic component between the active surface and the inactive surface of the electronic component, wherein ends of the through electronic component vias at the active surface define active surface through via terminals;
a package body enclosing the electronic component and directly contacting the sides;
a first die side buildup dielectric layer applied to the active surface of the electronic component and a first surface of the package body, a second surface of the package body being coplanar with the inactive surface of the electronic component;
a first die side circuit pattern in contact with the first die side buildup dielectric layer and electrically connected to the bond pads; and
through vias extending through the package body and the first die side buildup dielectric layer, the through vias being electrically connected to the first die side circuit pattern; and
a stacked device stacked on the fan out buildup substrate stackable package.

14. The assembly of claim 13 wherein the stacked device comprises a stacked electronic component.

15. The assembly of claim 13 wherein the stacked device comprises a stacked electronic component package.

16. The assembly of claim 13 wherein the stacked device comprises:
a second fan out buildup substrate stackable package comprising:
an electronic component comprising an active surface comprising bond pads;
a package body enclosing the electronic component of the second fan out buildup substrate stackable package;
a first die side buildup dielectric layer applied to the active surface of the electronic component and a first surface of the package body of the second fan out buildup substrate stackable package;

a first die side circuit pattern in contact with the first die side buildup dielectric layer and electrically connected to the bond pads of the second fan out buildup substrate stackable package; and through vias extending through the package body and the first die side buildup dielectric layer of the second fan out buildup substrate stackable package, the through vias of the second fan out buildup substrate stackable package being electrically connected to the first die side circuit pattern of the second fan out buildup substrate stackable package.

17. A fan out buildup substrate stackable package comprising:

an electronic component comprising:
   an active surface comprising bond pads;
   sides;
   an inactive surface; and
   through electronic component vias extending through the electronic component between the active surface and the inactive surface of the electronic component, wherein ends of the through electronic component vias at the active surface define active surface through via terminals;

a package body enclosing the electronic component and directly contacting the sides; a first die side buildup dielectric layer applied to the active surface of the electronic component and a first surface of the package body, a second surface of the package body being coplanar with the inactive surface of the electronic component;

a first die side circuit pattern in contact with the first die side buildup dielectric layer, the first die side circuit pattern comprising:
   bond pad vias extending entirely through the first die side buildup dielectric layer and being electrically connected to the bond pads;
   lands; and
   traces electrically connecting the bond pad vias to the lands; and through vias extending through the package body and the first die side buildup dielectric layer, the through vias being electrically connected to the lands.

18. The fan out buildup substrate stackable package of claim 17 further comprising:

a first mold side buildup dielectric layer applied to the second surface of the package body; and a first mold side circuit pattern in contact with the first mold side buildup dielectric layer, the first mold side circuit pattern comprising:
   lands electrically connected to the through vias; and
   traces electrically connected to the lands.

* * * * *